(12) United States Patent
Hirata et al.

(10) Patent No.: US 8,547,101 B2
(45) Date of Patent: Oct. 1, 2013

(54) MAGNETIC RESONANCE IMAGING DEVICE

(75) Inventors: Satoshi Hirata, Kodaira (JP); Yoshitaka Bito, Kokubunji (JP)

(73) Assignee: Hitachi Medical Corporation, Tokyo (JP)

( * ) Notice: Subject to any disclaimer, the term of this patent is extended or adjusted under 35 U.S.C. 154(b) by 356 days.

(21) Appl. No.: 13/123,299

(22) PCT Filed: Jul. 22, 2009

(86) PCT No.: PCT/JP2009/063109
§ 371 (c)(1),
(2), (4) Date: Apr. 8, 2011

(87) PCT Pub. No.: WO2010/044299
PCT Pub. Date: Apr. 22, 2010

(65) Prior Publication Data
US 2011/0196225 A1   Aug. 11, 2011

(30) Foreign Application Priority Data

Oct. 17, 2008  (JP) ................................. 2008-268938

(51) Int. Cl.
*G01V 3/00*  (2006.01)

(52) U.S. Cl.
USPC ....................................................... 324/318

(58) Field of Classification Search
USPC .......................... 324/300–322; 600/407–445
See application file for complete search history.

(56) References Cited

U.S. PATENT DOCUMENTS

| 4,480,228 | A |   | 10/1984 | Bottomley |
| 5,190,039 | A | * | 3/1993 | Takeuchi et al. .............. 600/311 |
| 6,054,853 | A |   | 4/2000 | Miyamoto et al. |
| 6,066,950 | A |   | 5/2000 | Tsukamoto et al. |
| 6,541,971 | B1 |   | 4/2003 | Dannels |
| 6,597,171 | B2 | * | 7/2003 | Hurlimann et al. ........... 324/303 |

FOREIGN PATENT DOCUMENTS

| JP | 59-107246 A | 6/1984 |
| JP | 61-79146 A | 4/1986 |
| JP | 61-275645 A | 12/1986 |
| JP | 63-164942 A | 7/1988 |
| JP | 11-137532 A | 5/1999 |
| JP | 11-128200 A | 6/1999 |
| JP | 2001-95773 A | 4/2001 |
| JP | 2001-231763 A | 8/2001 |
| JP | 2004-531352 A | 10/2004 |
| JP | 2009-82178 A | 4/2009 |

OTHER PUBLICATIONS

TH. Ernst et al., Double-Volume 1H Spectroscopy with Interleaved Acquisitions Using Tilted Gradients, Magnetic Resonance in Medicine 20, pp. 27-35, 1991.

* cited by examiner

*Primary Examiner* — Brij Shrivastav
(74) *Attorney, Agent, or Firm* — Mattingly & Malur, PC

(57) ABSTRACT

In MRS measurement using magnetic resonance highly precise results are efficiently obtained with coincidence of axes with axes in positioning image. In measurement according to the PRESS method for a plurality of regions each localized (specified) with a set of perpendicularly intersecting three slices, wherein one or two slices are common to the sets of three slices localizing the regions, and slices not common do not intersect, a slice not common to those of a region to be selectively excited is excited with a radio frequency magnetic field of which phase is different by 180 degrees from that of a radio frequency magnetic field used for exciting the region to be selectively excited a number of times equal to the number of common slices, and during the measurement of the region to be selectively excited, a group of regions other than the region to be selectively excited are thermally equilibrated.

8 Claims, 20 Drawing Sheets

100

200

300

Fig. 4A
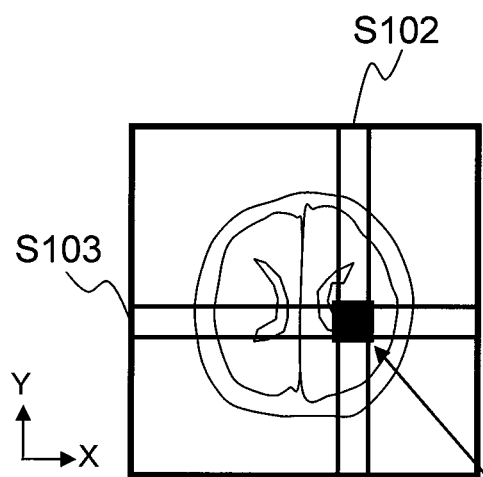
Fig. 4B
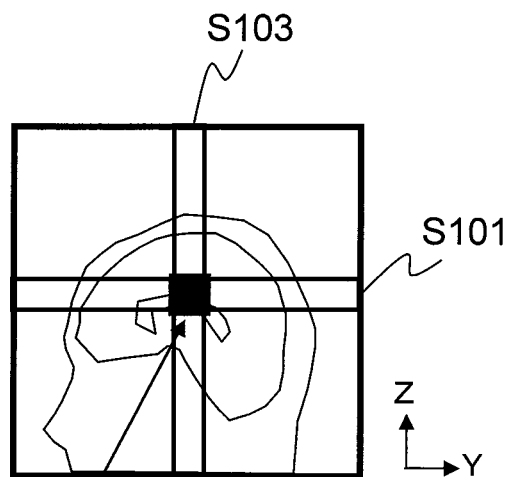
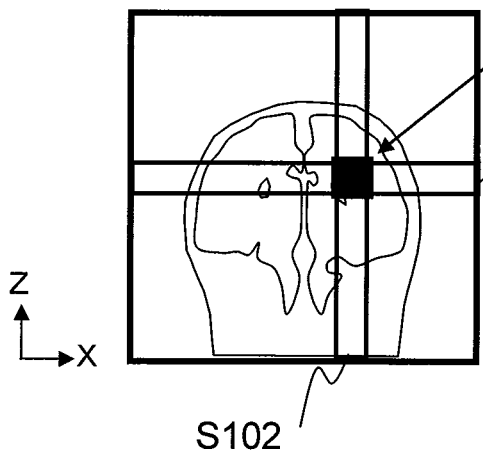
Fig. 4C

Fig. 5A
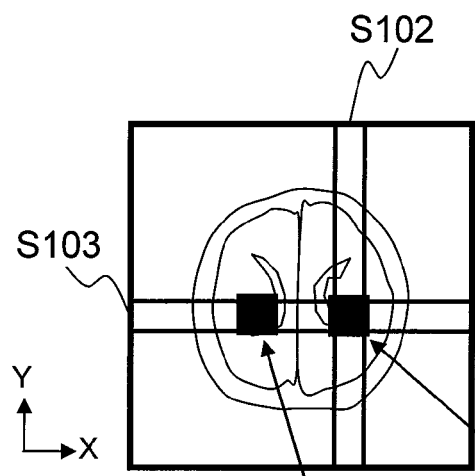
Fig. 5B
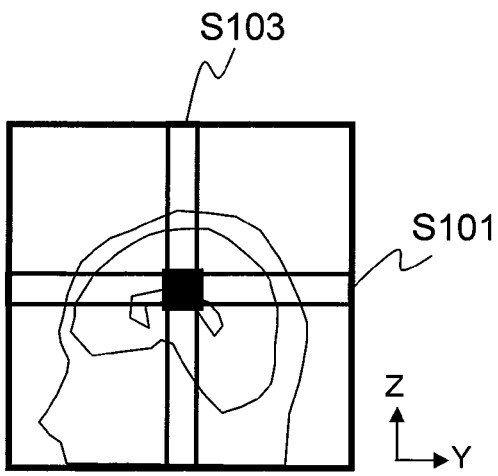
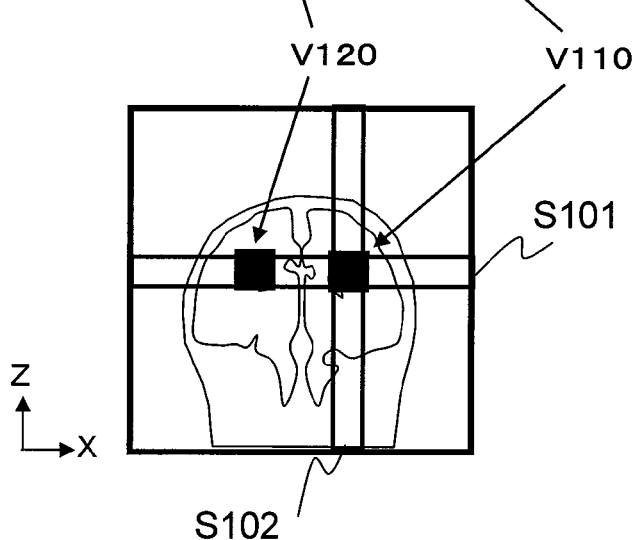
Fig. 5C

Fig. 7A
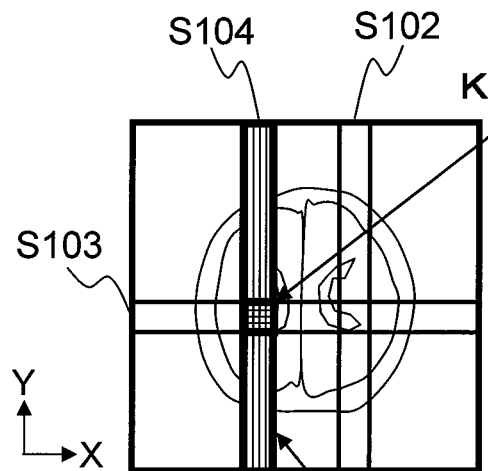
Fig. 7B
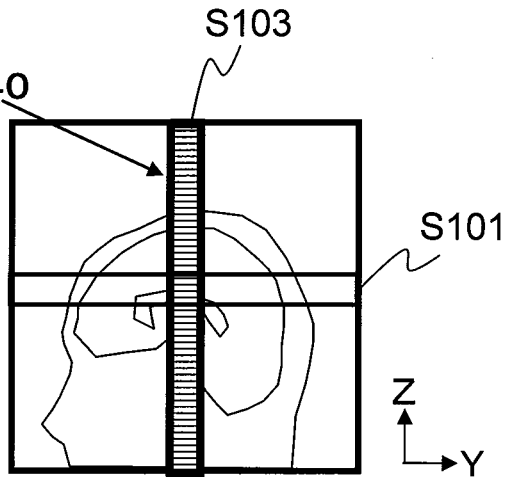
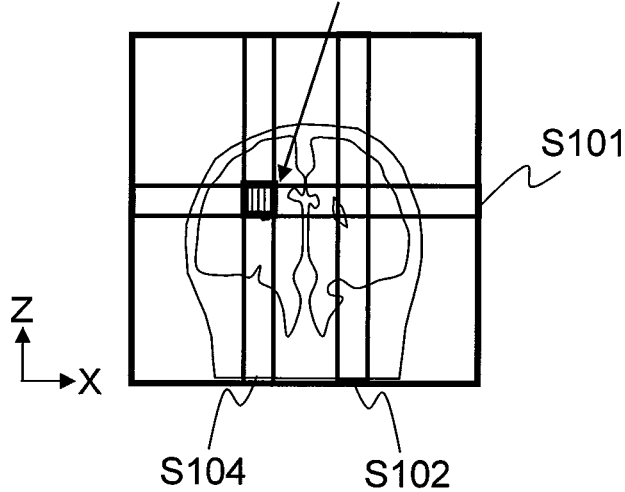
Fig. 7C

Fig. 12A
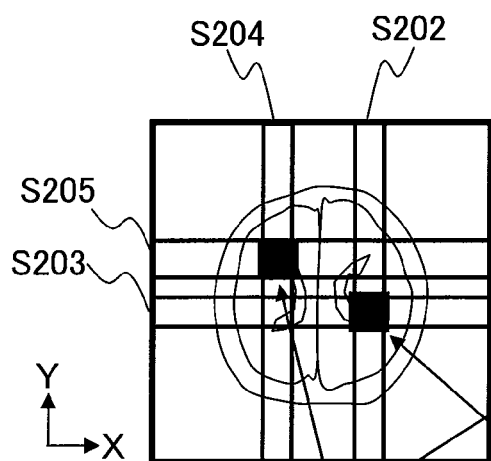
Fig. 12B
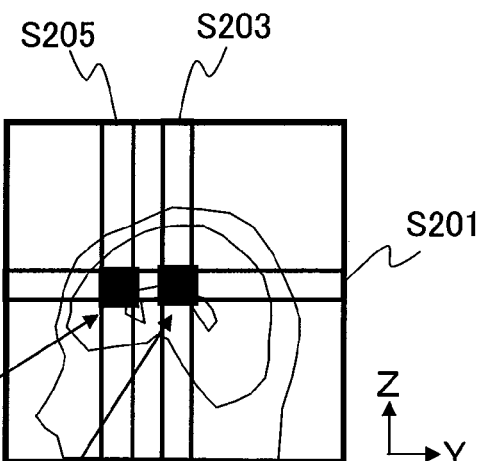
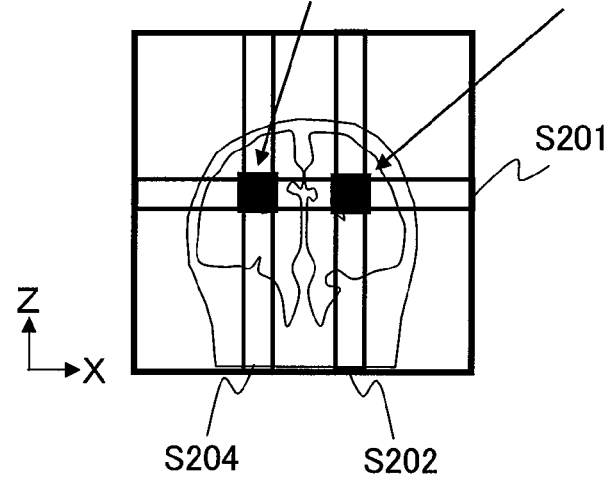
Fig. 12C

MAGNETIC RESONANCE IMAGING DEVICE

TECHNICAL FIELD

The present invention relates to a technique for acquiring information using a magnetic resonance imaging device, in particular, a technique of magnetic resonance spectroscopy (henceforth abbreviated as MRS) for acquiring metabolic information in organism.

BACKGROUND ART

Magnetic resonance imaging (henceforth abbreviated as MRI) devices irradiate a radio frequency magnetic field of a specific frequency to a subject placed in a static magnetic field to excite nuclear magnetization of atomic nuclei such as those of hydrogen contained in the subject, and detect magnetic resonance signals generated from the subject to obtain physical and chemical information. Measurement methods using MRI devices include, besides magnetic resonance imaging in which images are formed from magnetic resonance signals, the MRS measurement in which magnetic resonance signals acquired from one to several regions are separated into groups of signals for each molecule on the basis of difference of resonance frequency (henceforth referred to as chemical shift) due to difference in chemical bonds of various molecules to acquire information of metabolites (refer to, for example, Patent document 1).

The method described in Patent document 1 is a method called PRESS method, and it is currently most frequently used as a method for localizing an objective region of spectroscopy. In this method, together with a radio frequency magnetic field pulse for exciting nuclear magnetization, a gradient magnetic field pulse for selection of a predetermined slice is applied, then, together with a radio frequency magnetic field pulse for reversing the nuclear magnetization, gradient magnetic field pulses for selecting slices of two directions perpendicular to the aforementioned slice are applied, respectively, and magnetic resonance signals generated from a region where the three slices intersect are measured. Then, the measured magnetic resonance signals are subjected to Fourier transform in the time axis direction to acquire magnetic resonance spectrum signals.

The MRS measurement has a significant advantage that metabolites existing inside a subject can be non-invasively measured, which cannot be obtained by other measurement techniques. However, since concentrations of metabolites contained in a subject are extremely low, the signal versus noise ratio (henceforth referred to as SNR) frequently becomes low. Therefore, in the MRS measurement, the measurement is generally repeated about several tens to several hundreds of times, and the results are integrated to secure the required SNR and thereby increase accuracy of the result.

Moreover, with the MRS measurement, comparative measurement may be performed for a normal region and a pathological region. For example, when the object of the measurement is the head of human body, the measurement is performed for a pathological region and a normal region at a position line-symmetric to the pathological region with respect to the longitudinal fissure of cerebrum for comparison. However, since a region to be selectively excited is localized (specified) with perpendicularly intersecting three slices in the PRESS method as described above, if even one slice is common to the sets of slices for specifying both the measurement regions, during the selective excitation of one region, the other region is also pseudo saturated. Therefore, until thermal equilibrium is restored after the measurement of a selectively excited region, measurement for the other region cannot be performed. Therefore, when the measurement is repeated to secure SNR as described above, after measurement of one region, the time for waiting for restoration of thermal equilibrium of the region cannot be used for measurement of the other region.

In order that selective excitation of one region should not affect the other region, there is proposed a technique of applying gradient magnetic fields along axes each tilted by 45° from the X, Y and Z axes, so that the three slices used for selective excitation of one region (measurement region V1) and three slices used for selective excitation of the other region (measurement region V2) do not intersect one another, as shown in FIG. 19A (refer to, for example, Non-patent document 1). According to this technique, even if the one region (measurement region V1) is selectively excited, the other region (measurement region V2) maintains the thermal equilibrium, and therefore, immediately after the measurement of the selectively excited region (measurement region V1), the measurement of the other region (measurement region V2) can be started.

Further, as another method for shortening the time required for the MRS measurement of two regions, there is a method called STEAM method. This method uses three 90° pulses as the radio frequency magnetic field for excitation, and as shown in FIG. 20, two echo signals of different radio frequency magnetic field pulse irradiation intervals called TM (TM1 and TM2) are generated from two different regions in one measurement (within 1 TR) to obtain a shorter measurement time (refer to, for example, Patent document 2).

PRIOR ART REFERENCES

Patent Documents

Patent document 1: Japanese Patent Unexamined Publication (KOKAI) No. 59-107246
Patent document 2: Japanese Patent Unexamined Publication (KOKAI) No. 2001-231763

Non-Patent Documents

Non-patent document 1: T. Ernst and J. Henning, Double-Volume $^1$H Spectroscopy with Interleaved Acquisitions Using Tilted Gradients, Magnetic Resonance in Medicine, 20, pages 27-35 (1991)

SUMMARY OF THE INVENTION

Problem to be Solved by the Invention

However, in the technique described in Non-patent document 1, the axes defining the pixels of usual positioning image (cube or rectangular parallelepiped) and the axes defining an MRS measurement region are not correspond to each other, and therefore, when the MRS measurement region is projected on a positioning image (transverse image for positioning), a hexagonal region is displayed as shown in FIG. 19B (the measurement region does not have a hexagon pillar shape, but a cube or rectangular parallelepiped of which axes are tilted by 45° from the X, Y and Z axes serves as a region to be actually measured). If such difference in display is generated, it becomes difficult to accurately understand which position is measured.

Further, in the case of the technique described in Patent document 2, under general measurement conditions (for example, signal detection time of about 500 ms to 1 second), TM mentioned above greatly varies, and thus the measurement conditions of signals acquired from two different regions are greatly different from each other. Therefore, difference in quality of the obtained results also becomes significant. Therefore, even if the order of the signal generation is changed every time, it is difficult to obtain practically acceptable measurement results. Furthermore, the technique described in Patent document 2 is a technique applicable only to the pulse sequence for the STEAM method.

The present invention was accomplished under the above-mentioned circumstances, and an object of the present invention is to provide a technique for efficiently acquire highly accurate results in measurement of a plurality of regions defined with sets of slices that include at least one slice in common in the MRS measurement under such measurement conditions that the axes defining the MRS measurement region and the axes defining the pixel in the positioning image correspond to each other.

Means to Solve the Problem

According to the present invention, in measurement according to the PRESS method for a plurality of regions each localized (specified) with a set of perpendicularly intersecting three slices, wherein one or two slices are common to the sets of three slices localizing the regions, and slices not common do not intersect, a slice not common to those of a region to be selectively excited is excited with a radio frequency magnetic field of which phase is different by 180 degrees from that of a radio frequency magnetic field used for exciting the region to be selectively excited a number of times equal to the number of common slices, and during the measurement of the region to be selectively excited, a group of regions other than the region to be selectively excited are thermally equilibrated.

Specifically, the present invention provides a magnetic resonance imaging device comprising magnetic field generating means for generating a static magnetic field, a radio frequency magnetic field, and a gradient magnetic field, respectively, a detection means for detecting magnetic resonance signals generated from a subject placed in the static magnetic field, a calculation means for creating a magnetic resonance spectrum from the magnetic resonance signals and displaying the spectrum on a display, and a measurement control means for controlling operations of the magnetic field generating means, the detection means, and the calculation means to perform measurement, wherein the measurement control means comprises a selective excitation means for localizing and selecting a first region that generates the magnetic resonance signals with the radio frequency magnetic field and the gradient magnetic field, and a steadying means for thermally equilibrating nuclear magnetization in one or more second regions different from the first region with the radio frequency magnetic field and the gradient magnetic field during the localization of the first region by the selective excitation means, the first region and the second regions are each specified with perpendicularly intersecting three slices, one or two slices among the three slices specifying each region are common, and the slices of not common are located completely different position, and the steadying means steadies nuclear magnetization in the second regions by using a radio frequency magnetic field of which phase is different by 180 degrees from that of the radio frequency magnetic field used by the selective excitation means.

Effect of the Invention

According to the present invention, when a plurality of regions defined with sets of slices including at least one common slice are measured in the MRS measurement under such measurement conditions that the axes defining the MRS measurement region and the axes defining the pixel in the positioning image correspond to each other, highly accurate results can be efficiently acquired.

BRIEF DESCRIPTION OF THE DRAWINGS

FIG. 4A is a drawing of a transverse image for positioning for explaining a region to be excited and reversed in the PRESS method.

FIG. 4B is a drawing of a sagittal image for position reference for explaining a region to be excited and reversed in the PRESS method.

FIG. 4C is a drawing of a coronal image for position reference for explaining a region to be excited and reversed in the PRESS method.

FIG. 5A is a drawing of a transverse image showing an example of positional relationship of an excitation and reversion region and a measurement region in measurement of two different regions lined on one straight line in the same slice by the PRESS method.

FIG. 5B is a drawing of a sagittal image showing an example of positional relationship of an excitation and reversion region and a measurement region in measurement of two different regions lined on one straight line in the same slice by the PRESS method.

FIG. 5C is a drawing of a coronal image showing an example of positional relationship of an excitation and reversion region and a measurement region in measurement of two different regions lined on one straight line in the same slice by the PRESS method.

FIG. 7A is a drawing of a transverse image for positioning for explaining a slice excited and reversed with the pulse sequence according to the first embodiment.

FIG. 7B is a drawing of a sagittal image for position reference for explaining a slice excited and reversed with the pulse sequence according to the first embodiment.

FIG. 7C is a drawing of a coronal image for position reference for explaining a slice excited and reversed with the pulse sequence according to the first embodiment.

FIG. 12A is a drawing of a transverse image for positioning for explaining a region to be measured with the pulse sequence according to the second embodiment.

FIG. 12B is a drawing of a sagittal image for position reference for explaining a region to be measured with the pulse sequence according to the second embodiment.

FIG. 12C is a drawing of a coronal image for position reference for explaining a region to be measured with the pulse sequence according to the second embodiment.

MODES FOR CARRYING OUT THE INVENTION

First Embodiment

Hereafter, the first embodiment that of the present invention will be explained with reference to the drawings. In all of the drawings for explaining the embodiments of the present invention mentioned below, elements having the same function are indicated with the same numerals or symbols, and repetition of the explanations thereof are omitted.

Figure 1A:
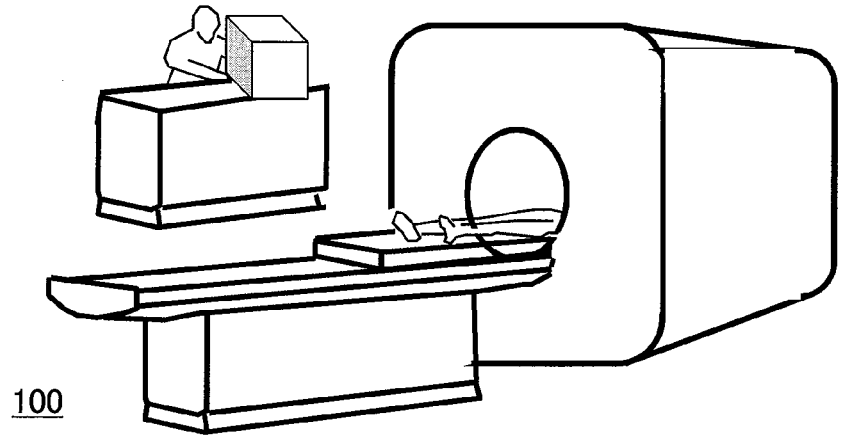
FIG. 1A is an external view of an MRI device of the horizontal magnetic field type according to the first embodiment.
Figure 1B:
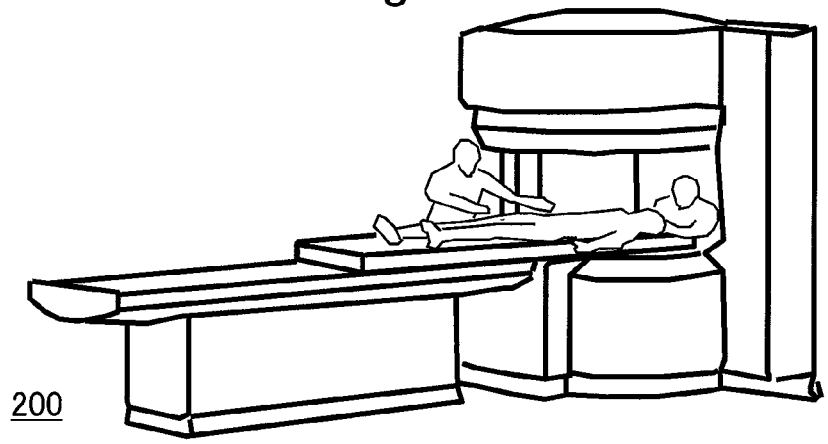
FIG. 1B is an external view of an MRI device of the vertical magnetic field type according to the first embodiment.
Figure 1C:
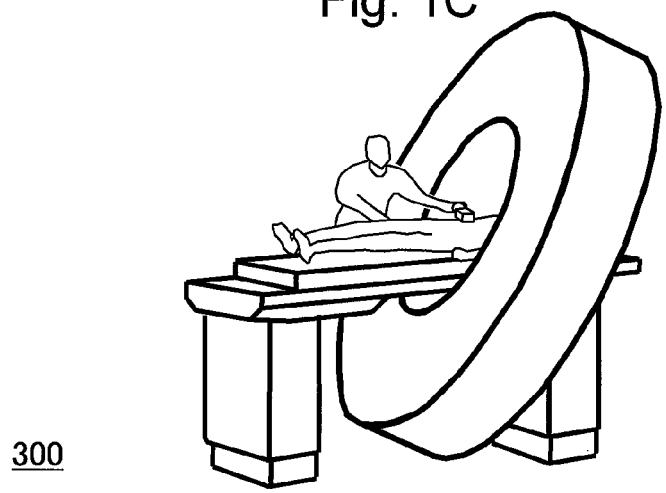
FIG. 1C is an external view of an MRI device according to the first embodiment, in which spaciousness is increased.

First, the MRI device according to this embodiment will be explained. FIGS. 1A to 1C are external views of MRI devices according to this embodiment. FIG. 1A shows an MRI device 100 of the horizontal magnetic field type using a tunnel-shaped magnet that generates a static magnetic field with a solenoid coil. FIG. 1B shows a hamburger type (open type) MRI device 200 of the vertical magnetic field type, in which the magnet is separated into upper and lower magnets in order to increase spaciousness. FIG. 1C shows an MRI device 300, which is a tunnel shape MRI device like the device shown in FIG. 1A, provided that a leaned magnet having a shortened depth is used to increase spaciousness. These are examples, and the MRI device of this embodiment is not limited to these forms. For this embodiment, various kinds of known MRI devices can be used irrespective of forms and types thereof. The MRI device 100 will be representatively explained in the following descriptions, unless a specific type of device must be referred to.

Figure 2:
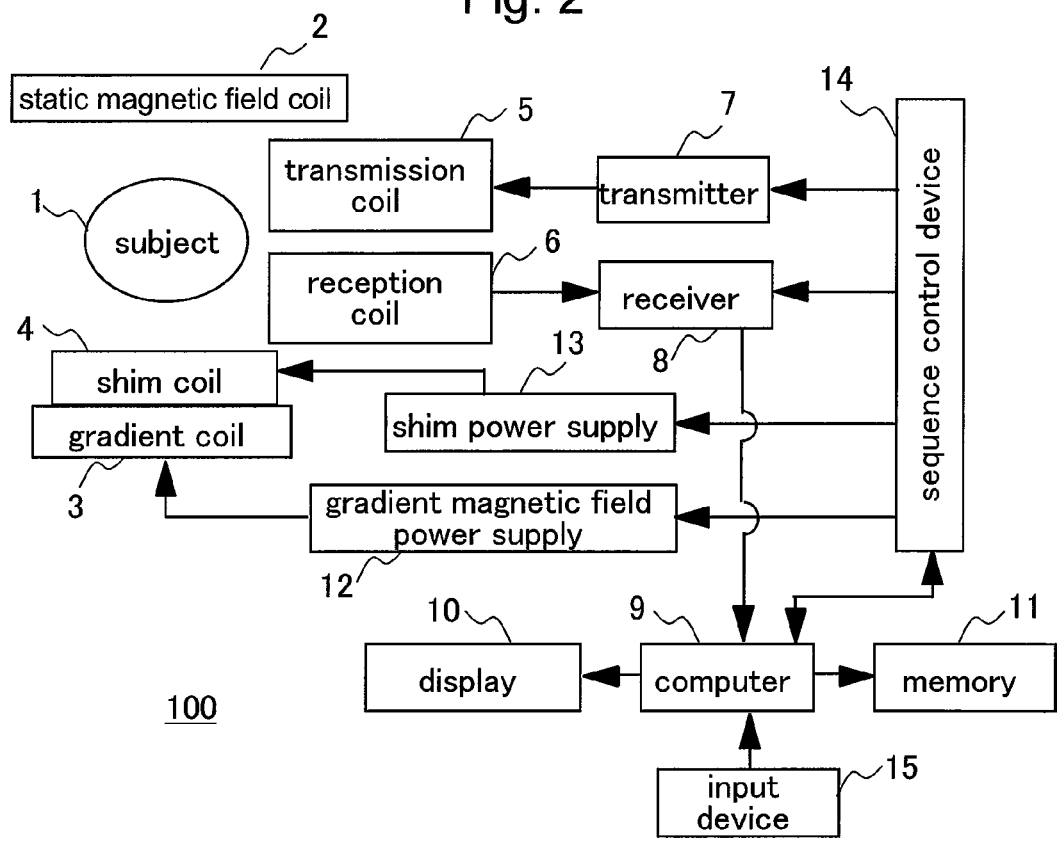
FIG. 2 is a block diagram showing configuration of an MRI device according to the first embodiment.

FIG. 2 is a block diagram showing the configuration of the MRI device 100 of this embodiment. The MRI device 100 of this embodiment is provided with a static magnetic field coil 2 for generating a static magnetic field over a space in which a subject 1 is placed, a gradient coil 3 for applying perpendicularly intersecting gradient magnetic fields of three directions, a radio frequency transmission coil 5 (henceforth simply referred to as transmission coil) for irradiating a radio frequency magnetic field to the subject 1, a radio frequency reception coil 6 (henceforth simply referred to as reception coil) for receiving magnetic resonance signals generated from the subject 1, and a shim coil 4 for adjusting uniformity of the static magnetic field. The shim coil 4 may not be included.

As the static magnetic field coil 2, those of various forms are used according to the structures of the MRI devices 100, 200 and 300 shown in FIGS. 1A, 1B, and 1C. The gradient coil 3 and the shim coil 4 are driven by a gradient magnetic field power supply 12 and a shim power supply 13, respectively. The radio frequency magnetic field irradiated by the transmission coil 5 is generated by a transmitter 7 and applied to the subject 1 placed in the static magnetic field. The magnetic resonance signals detected by the reception coil 6 are sent to a computer 9 via a receiver 8. Although this embodiment is explained by exemplifying a case of using separate transmission coil 5 and reception coil 6, one coil serving as both the transmission coil 5 and the reception coil 6 may also be used.

The computer 9 executes various processing operations for the magnetic resonance signals acquired through the receiver 8 according to a program stored beforehand or directions given by a user to generate spectrum information or image information. To the computer 9, a display 10, a memory 11, a sequence control device 14, an input device 15, and so forth are connected. The display 10 is an interface for displaying the generated spectrum information or image information for an operator. The input device 15 is an interface for an operator to input measurement conditions, conditions and parameters required for processing operations, and so forth. In the memory 11, spectrum information or image information generated by the computer 9, information inputted via the input device 15, and so forth are recorded as required.

The sequence control device 14 controls operations of the gradient magnetic field power supply 12, the shim power supply 13, the transmitter 7 and the receiver 9, and controls timings of application of the gradient magnetic fields and the radio frequency magnetic field and reception of the magnetic resonance signals, amount of the application, and so forth. The timings are controlled according to a time chart called pulse sequence, which is set beforehand according to the imaging method. Selection of pulse sequence to be used and detailed conditions such as application amounts of the magnetic fields are stored beforehand in the memory 11 as a program or directed by a user via the input device 15.

Figure 3:
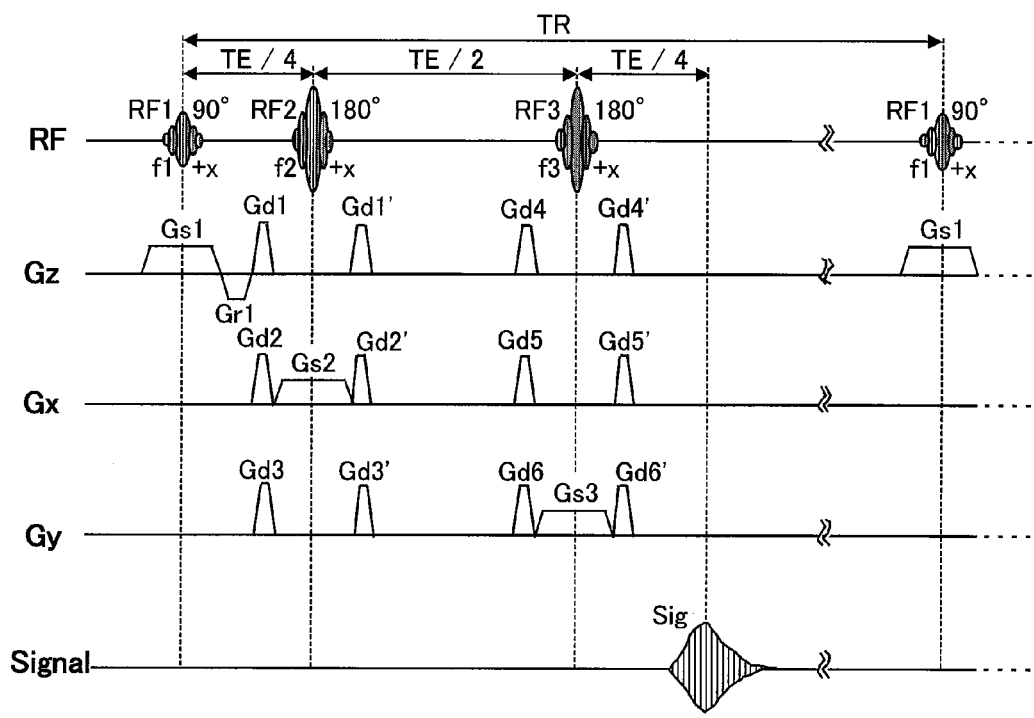
FIG. 3 shows an example of pulse sequence for the PRESS method.

FIG. 3 is a drawing for explaining an example of MRS pulse sequence for the PRESS method serving as the basis of this embodiment. For this example, the MRI device 100 of the horizontal magnetic field type is used, and the direction of the static magnetic field is the Z axis direction. In this pulse sequence, RF represents radio frequency magnetic field, Gz represents gradient magnetic field of the Z axis direction, Gx represents gradient magnetic field of the X axis direction, Gy represents gradient magnetic field of the Y axis direction, and Signal represents magnetic resonance signal (echo signal). The same shall apply to the following descriptions in this specification. Further, FIGS. 4A, 4B, and 4C are drawings for explaining a region to be excited and reversed with the pulse sequence shown in FIG. 3. The images shown in FIGS. 4A, 4B, and 4C are scout images for positioning and reference obtained in advance of the main scan. FIG. 4A is a transverse image for positioning, FIG. 4B is a sagittal image for position reference, and FIG. 4C is a coronal image for position reference. Hereafter, the relationship between operations of the parts and a region to be excited according to the PRESS method is explained with reference to FIGS. 3, 4A, 4B, and 4C. In the following explanation, the region to be measured is a region (voxel) V110 where a first slice S101 perpendicular to the Z axis, a second slice S102 perpendicular to the X axis, and a third slice S103 perpendicular to the Y axis intersect with one another. Further, in the following explanation, echo time is referred to as TE.

First, a gradient magnetic field Gs1 for slice selection in the Z axis direction is applied, and a radio frequency magnetic field having a flip angle of 90° (90° pulse) RF1 is irradiated at the same time to selectively excite nuclear magnetization only in the first slice S101. A transmission frequency f1 of the 90° pulse RF1 is determined so that the first slice S101 selected in combination with the gradient magnetic field Gs1 includes the measurement region V110. Transmission frequency, excitation (reversion) frequency band, excitation (flip) angle and transmission phase of all the radio frequency magnetic fields mentioned below can be adjusted, and "position and thickness of slice" to be selectively excited/reversed and "angle and direction for tilting nuclear magnetization" contained in a selected slice can be arbitrarily changed.

Then, after TE/4 from the irradiation of the 90° pulse RF1, a gradient magnetic field Gs2 for slice selection in the X axis direction is applied, and a radio frequency magnetic field having a flip angle of 180° (180° pulse) RF2 is irradiated at the same time to reverse by 180° only nuclear magnetization in the first slice S101 excited by the 90° pulse RF1, also included in the second slice S102. A transmission frequency f2 of the 180° pulse RF2 is determined so that the second slice S102 selected in combination with the gradient magnetic field Gs2 should include the measurement region V110.

Furthermore, after TE/2 from the irradiation of the 180° pulse RF2, a gradient magnetic field Gs3 for slice selection in the Y axis direction is applied, and a 180° pulse RF3 is irradiated at the same time to reverse by 180° again only nuclear magnetization in the region V110 also included in the third slice S103 among the nuclear magnetization reversed by the 180° pulse RF2 in a region where the first slice S101 and the second slice S102 intersect. A transmission frequency f3 of the 180° pulse RF3 is determined so that the third slice S103 selected in combination with the gradient magnetic field Gs3 should include the measurement region V110. In this pulse sequence, +x indicated after the transmission frequencies of the radio frequency magnetic fields represent phases of the radio frequency magnetic fields. With this pulse sequence, all of the 90° pulse RF1, the 180° pulse RF2, and the 180° pulse RF3 are irradiated with the same phase (+x).

By application (irradiation) of these three sets of gradient magnetic fields and radio frequency magnetic fields, inside of the measurement region V110 is selectively excited, and a magnetic resonance signal Sig of which echo time is at the point after TE/4 from the irradiation of the 180° pulse RF3 is generated from the region V110. The generated magnetic resonance signal Sig has signal change in the time axis direction, and includes information on the chemical shift mentioned above. This magnetic resonance signal Sig is detected at a predetermined sampling interval, and subjected to Fourier transform in the time axis direction to obtain magnetic resonance spectrum signals.

In the pulse sequence shown in this drawing, a gradient magnetic field Gr1 applied immediately after the application of the gradient magnetic field Gs1 is a gradient magnetic field for rephasing for the gradient magnetic field Gs1. Further, a gradient magnetic field Gd1 and a gradient magnetic field Gd1', a gradient magnetic field Gd2 and a gradient magnetic field Gd2', and a gradient magnetic field Gd3 and a gradient magnetic field Gd3', which are applied before and after the irradiation of the 180° pulse RF2, are gradient magnetic fields for dephasing only the nuclear magnetization excited by the irradiation of the 180° pulse RF2 without dephasing the nuclear magnetization excited by the irradiation of the 90° pulse RF1 and thereby reducing pseudo signals. Further, a gradient magnetic field Gd4 and a gradient magnetic field Gd4', a gradient magnetic field Gd5 and a gradient magnetic field Gd5', and a gradient magnetic field Gd6 and a gradient magnetic field Gd6', which are applied before and after the irradiation of the 180° pulse RF3, are gradient magnetic fields for dephasing only the nuclear magnetization excited by the irradiation of the 180° pulse RF3 without dephasing the nuclear magnetization excited by the irradiation of the 90° pulse RF1 and thereby reducing pseudo signals.

By executing the above MRS pulse sequence, as shown in FIGS. 4A, 4B, and 4C, only the nuclear magnetization included in the measurement region V110 where the three slices S101, S102 and S103 intersect can be selectively excited, and the magnetic resonance signal Sig from the measurement region V110 can be detected. For the purpose of integration for securing required SNR, if the detection of the magnetic resonance signal Sig by the aforementioned procedure is repeated N times (usually about several tens to several hundreds times) at an interval of the repetition time TR, the total measurement time is calculated as "repetition time× number of times of integration=TR×N". This repetition time TR is determined according to the time required for the excited nuclear magnetization to restore to the thermally equilibrated state before the excitation, and it may change according to type of metabolite as the object of the excitation, RF irradiation intensity (flip angle) for the excitation, or the like. When nuclear magnetization of a usual metabolite in a human body measurable by MRS is excited with a 90° pulse, the repetition time TR is usually set to be about 1 to 2 seconds.

Here, there is considered a case where two regions as shown in FIGS. 5A, 5B, and 5C (first measurement region (henceforth referred to as first region) V110 and second measurement region (henceforth referred to as second region)

V120) are measured, and two slices (first slice S101 and third slice S103 in this example) are commonly included in the sets of three slices localizing the regions. When the first region V110 is selectively excited with the MRS pulse sequence shown in FIG. 3, nuclear magnetization in the first slice S101 is excited by the 90° pulse RF1 and the gradient magnetic field Gs1, and nuclear magnetization in the third slice S103 is excited by the 180° pulse RF3 and the gradient magnetic field Gs3. Since these slices are slices also localizing the second region V120, the second region V120 is also pseudo saturated after the irradiation of the 180° pulse RF3. Therefore, for example, when the second region V120 is measured after the first region V110 is measured, it is necessary to wait for restore of the nuclear magnetization in the second region V120 to a thermally equilibrated state. Since this waiting time (T1 relaxation time) is substantially equal to the repetition time TR, the total measurement time is simply doubled time, "repetition time×number of times of integration×number of measurement region=TR×N×2".

Figure 6:
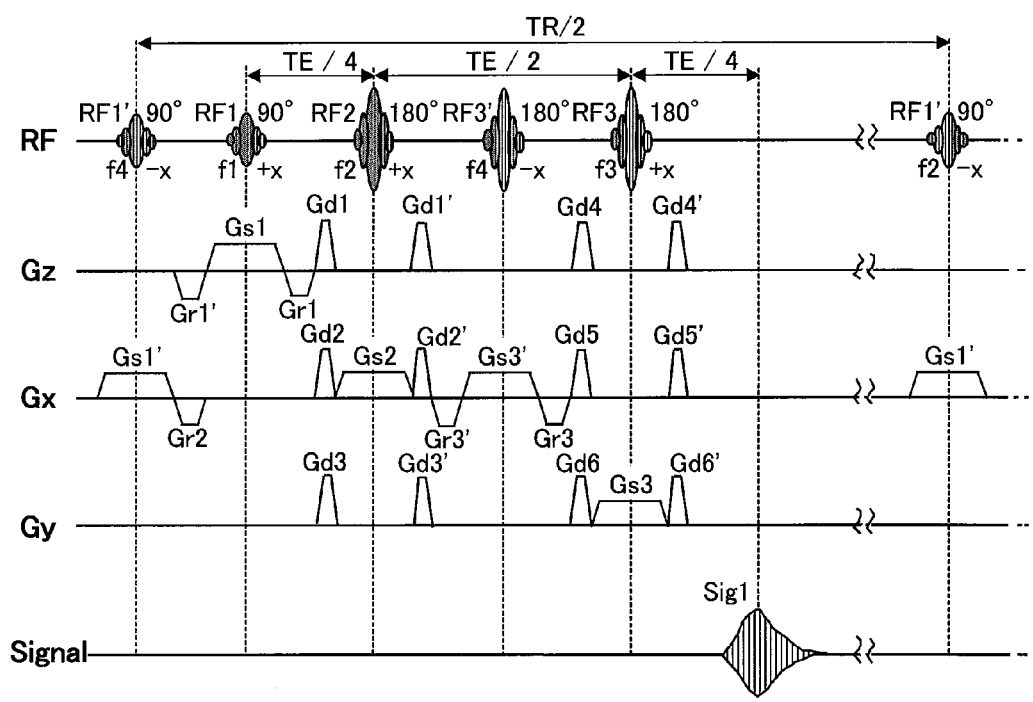
FIG. 6 shows an example of pulse sequence according to the first embodiment.
Figure 8A:
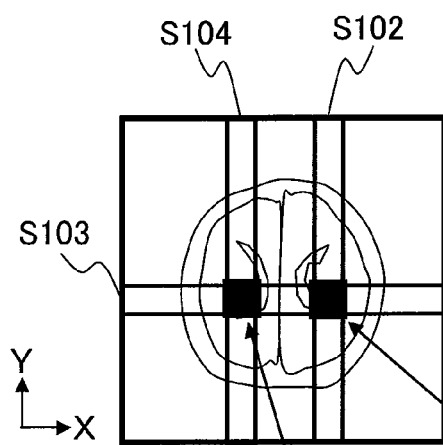
FIG. 8A is a drawing of a transverse image for positioning for explaining a region to be measured with the pulse sequence according to the first embodiment.
Figure 8B:
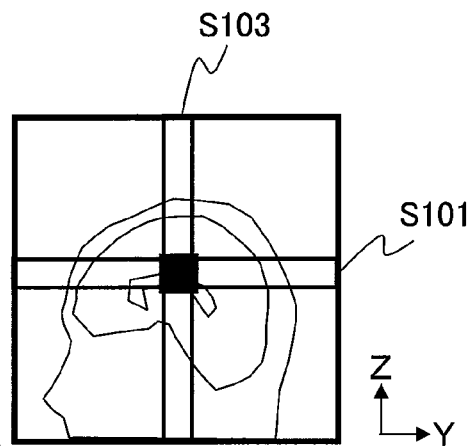
FIG. 8B is a drawing of a sagittal image for position reference for explaining a region to be measured with the pulse sequence according to the first embodiment.
Figure 8C:
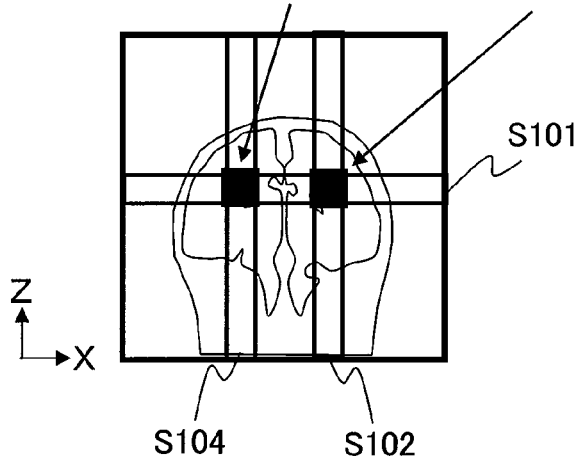
FIG. 8C is a drawing of a coronal image for position reference for explaining a region to be measured with the pulse sequence according to the first embodiment.

In this embodiment, the pulse sequence is configured so that the second region V120 is restored to a thermally equilibrated state during the selective excitation of the first region V110. Hereafter, the MRS pulse sequence of this embodiment for realizing the above will be explained. FIG. 6 is a drawing for explaining an example of the MRS pulse sequence of this embodiment. FIGS. 7A, 7B, and 7C are drawings for explaining the region excited and reversed with the MRS pulse sequence shown in FIG. 6. Further, FIGS. 8A, 8B, and 8C are drawings for explaining a region to be measured. Among the images shown in FIGS. 7A, 7B, 7C, 8A, 8B, and 8C, images of FIGS. 7A and 8A are transverse images for positioning, images of FIGS. 7B and 8B are sagittal images for position reference, and images of FIGS. 7C and 8C are coronal images for position reference. This MRS pulse sequence is stored in the memory 11. In the MRI device 100 of this embodiment, the sequence control device 14 operates the parts according to directions given by the computer 9 to perform the MRS measurement.

First, the measurement region of this embodiment is explained. The measurement region of this embodiment consists of the first region V110 and the second region V120 shown in FIGS. 8A to 8C. The first region V110 is localized (specified) with the first slice S101, the second slice S102, and the third slice S103. Further, the second region V120 is localized (specified) with the first slice S101, the fourth slice S104, and the third slice S103. Thus, the first slice S101 and the third slice S103 are common for the first region V110 and second region V120. The second slice S102 and the fourth slice S104 are completely different from each other. Further, thicknesses of the second slice S102 and the fourth slice S104 are not particularly limited. Both the regions are lined on one straight line in the first slice S101 along the third slice S103. Hereafter, two regions of which arrangement and size are in such a relationship as described above are referred to as regions lined on one straight line in the same slice.

Hereafter, as for two regions lined on one straight line in the same slice, there will be explained such an MRS pulse sequence of this embodiment that, when one region (for example, first region V110) is selectively excited by the PRESS method, the other region (second region V120) is thermally equilibrated. This sequence generally intends that, immediately before exciting common slices, slices not common are excited by using a radio frequency magnetic field of which phase is different by 180° from that of the radio frequency magnetic field used for exciting the common slices, and immediately before reversion of the common slices, the slices not common are reversed by using a radio frequency magnetic field of which phase is different by 180° from that of the radio frequency magnetic field used for reversing the common slices. When the common slices are excited and reversed with this sequence, the region at which the both slices intersect (including the second region V120, but not including the first region V110) is thermally equilibrated. Hereafter, detailed procedure will be explained with reference to the drawings mentioned above.

As shown in FIG. 6, in the first place, in order to obtain an excited state of nuclear magnetization in the fourth slice S104 including the second region V120 and parallel to the second slice S102, a gradient magnetic field Gs1' of the X axis direction for selection of the fourth slice S104 is applied, and a 90° pulse RF1' having a first transmission frequency f4 is irradiated at the same time. The first transmission frequency f4 is determined so that the fourth slice S104 selected in combination with the gradient magnetic field Gs1' includes the second region V120, but does not include the first region V110. Hereafter, this embodiment will be explained by exemplifying a case where slice thickness of the fourth slice S104 is set to be equivalent to the width of the second region V120 in the X axis direction, and further, the phase of the 90° pulse RF1' is −x.

After completion of the application of the gradient magnetic field Gs1', the gradient magnetic field Gs1 of the Z axis direction for selection of the first slice S101 perpendicularly intersecting with the application axis of the gradient magnetic field Gs1' is applied, and the 90° pulse RF1 having a phase (+x) corresponding to 180° reverse of the phase (−x) of the 90° pulse RF1' is irradiated at the same time. The transmission frequency f1 of the 90° pulse RF1 is determined so that the first slice S101 selected in combination with the gradient magnetic field Gs1 includes the first region V110. Here, explanation will be made by exemplifying a case where slice thickness of the first slice S101 is set to be equivalent to the width of the first region V110 in the Z axis direction. As shown in FIGS. 7A to 7C, the nuclear magnetization in the intersecting region K130 where the fourth slice S104 and the first slice S101 intersect is thereby restored to be in a substantially thermally equilibrated state, and nuclear magnetization in the first slice S101 except for the intersecting region K130 is made to be in an excited state.

Then, after TE/4 from the irradiation of the 90° pulse RF1, the gradient magnetic field Gs2 of the X axis direction for selection of the second slice S102 is applied, and the 180° pulse RF2 having a second transmission frequency f1 different from the first transmission frequency f4 is irradiated at the same time. The second transmission frequency f1 is determined so that the second slice S102 selected in combination with the gradient magnetic field Gs2 includes the first region V110, but does not include the second region V120. Here, explanation will be made by exemplifying a case where slice thickness of the second slice S102 is set to be equivalent to the width of the first region V110 in the X axis direction. Among the nuclear magnetization in the first slice S101 except for the intersecting region K130 excited by the 90° pulse RF1, nuclear magnetization also included in the second slice S102 is thereby reversed by 180°.

After completion of the application of the gradient magnetic field Gs2, a gradient magnetic field Gs3' of the X axis direction for selection of the fourth slice S104 of which axis is the same as the application axis of the gradient magnetic field Gs1' is applied, and a 180° pulse RF3' having the first transmission frequency f4 is applied at the same time. The phase of the 180° pulse RF3' is −x, like the 90° pulse RF1'. The nuclear magnetization in the fourth slice S104 is thereby made to be in a reversed state. The transmission frequency of the 180 degree pulse RF3' is the same as the transmission frequency f4 of the 90° pulse RF1' in this example, but it is not limited to this. So long as the slice selected in combination with the gradient magnetic field Gs3' includes the second region V120 and does not include the first region V110, it may differ from the first transmission frequency f4.

Furthermore, after TE/2 from the irradiation of the 180° pulse RF2, the gradient magnetic field Gs3 of the Y axis direction for selection of the third slice S103 perpendicularly intersecting with the application axes of the gradient magnetic field Gs1 and the gradient magnetic field Gs2 is applied, and the 180° pulse RF3 having a phase (+x) corresponding to 180° reverse of the phase of RF3' (−x) is irradiated at the same time. As shown in FIGS. 7A to C, the nuclear magnetization in the intersecting region K140 where the third slice S103 and the fourth slice S104 intersect is thereby restored to be in a substantially thermally equilibrated state, and the nuclear magnetization in the third slice S103 except for the intersecting region K140 is reversed. The transmission frequency f3 of the 180° pulse RF3 is determined so that the third slice S103 selected in combination with the gradient magnetic field Gs3 includes the first region V110. This example is an example of the case where slice thickness of the third slice S103 is set to be equivalent to the width of the first region V110 in the Y axis direction. Although the explanation is made with the phases of RF3' and RF3 of −x and +x, they are not limited to these. It is sufficient that the phases of RF3' and RF3 differ by 180°, and for example, they may be −y and +y.

By the application of the five sets of the radio frequency magnetic fields and the gradient magnetic fields mentioned above, a magnetic resonance signal Sig1 of which echo time is at a point after TE/4 from the irradiation of the 180° pulse RF3 is generated from the first region V110. This magnetic resonance signal Sig1 is detected with the reception coil 6 at a predetermined sampling interval.

Also in this pulse sequence, the gradient magnetic field Gr2 applied immediately after the application of the gradient magnetic field Gs1' is a gradient magnetic field for rephasing for the gradient magnetic field Gs1'. Further, the gradient magnetic field Gr1' and the gradient magnetic field Gr1, which are applied before and after the application of the gradient magnetic field Gs1, are gradient magnetic fields for dephasing and rephasing for the gradient magnetic field Gs1. Furthermore, the gradient magnetic field Gd1 and the gradient magnetic field Gd1', the gradient magnetic field Gd2 and the gradient magnetic field Gd2', and the gradient magnetic field Gd3 and the gradient magnetic field Gd3', which are applied before and after the application of the 180° pulse RF2, are gradient magnetic fields for dephasing the nuclear magnetization excited by the irradiation of the 180° pulse RF2 without dephasing the nuclear magnetization excited by the irradiation of the 90° pulse RF1, and thereby reducing pseudo signals. Further, the gradient magnetic field Gr3' and the gradient magnetic field Gr3, which are applied before and after the application of the gradient magnetic field Gs3', are gradient magnetic fields for dephasing and rephasing for the gradient magnetic field Gs3'. Furthermore, the gradient magnetic field Gd4 and the gradient magnetic field Gd4', the gradient magnetic field Gd5 and the gradient magnetic field Gd5', and the gradient magnetic field Gd6 and the gradient magnetic field Gd6', which are applied before and after the application of the 180° pulse RF3, are gradient magnetic fields for dephasing the nuclear magnetization excited by the irradiation of the 180° pulse RF3 without dephasing the nuclear magnetization excited by the irradiation of the 90° pulse RF1, and thereby reducing pseudo signals.

As explained above, by executing the MRS pulse sequence of this embodiment, as shown in FIGS. 8A, 8B, and 8C, only the nuclear magnetization within the first region V110 where the three slices of the first slice S101, the second slice S102 and the third slice S103 intersect can be selectively excited, and the nuclear magnetization within the second region V120 where the fourth slice S104, the first slice S101 and the third slice S103 intersect can be maintained to be in a substantially thermally equilibrated state.

When the magnetic resonance signal Sig1 of the first region V110 is measured, the second region V120 is made to be in a substantially thermally equilibrated state. Therefore, the excitation of the second region V120 can be started immediately after the excitation and detection of the first region V110. Accordingly, when the measurement is performed by repeating excitation and detection for securing SNR, the excitation and detection of the second region V120 can be performed during the waiting time for waiting for the nuclear magnetization in the first region V110 to a substantially thermally equilibrated state (for example, TR/2).

For example, the MRS pulse sequence of this embodiment is executed to acquire a magnetic resonance signal Sig1 from the first region V110, and immediately after that, a similar measurement is performed by changing the transmission frequency of the 90° pulse RF1' to f2, the transmission frequency of the 180° pulse RF2 to f4, and the transmission frequency of the 180° pulse RF3' to f1 to detect the magnetic resonance signal Sig2 from the second region V120 at a predetermined sampling interval. Also in this case, when the magnetic resonance signal Sig2 from the second region V120 is measured, the first region V110 is made to be in a substantially thermally equilibrated state. Therefore, the excitation and detection of the first region V110 can be performed during the waiting time for waiting for the nuclear magnetization in the second region V120 to restore to a substantially thermally equilibrated state (for example, TR/2).

As explained above, when the first region V110 and the second region V120 are lined on one straight line in the same slice, the MRS pulse sequence of this embodiment enables measurement of the two regions during one TR by alternately performing the "measurement of the first region V110" and the "measurement of the second region V120" with a repetition time TR/2. In this case, the excitation and detection of the first region V110 and the second region V120 are repeated substantially at an interval of the repetition time TR, and the nuclear magnetization in each region is excited from a steady state (substantially thermally equilibrated state) similar to that at the time of measurement of one region, and detected. Therefore, by performing Fourier transform of integrated magnetic resonance signals Sig1 repeatedly detected from the first region V110, and integrated magnetic resonance signals Sig2 repeatedly detected from the second region V120 in the time axis direction, magnetic resonance spectrum signals from the first region V110 and magnetic resonance spectrum signals from the second region V120 can be acquired, respectively.

As explained above, when two different regions lined on one straight line in the same slice are measured with the MRS pulse sequence of this embodiment, during excitation of a region to be selectively excited (selective excitation region), a slice among perpendicularly intersecting three slices localizing a region not selectively excited (selectively non-excited region) not common to the slices localizing the selective excitation region is excited by using a radio frequency magnetic field of which phase is different by 180° from that of the radio frequency magnetic field used for exciting the selective excitation region. This excitation is performed a number of times corresponding to the number of common slices. As described above, the nuclear magnetization in the selectively non-excited region is restored to a substantially thermally equilibrated state during the excitation of the selective excitation region.

Therefore, if the MRS pulse sequence of this embodiment is used in the MRS measurement using the MRI device of this embodiment to perform measurement of two different regions lined on one straight line in the same section, after detection of a magnetic resonance signal of one region, and during the waiting time for waiting for the nuclear magnetization in the region to restore to a substantially thermally equilibrated state, measurement of the other region can be performed. Therefore, even when the number of measurement region is doubled, the total measurement time can be controlled to be not longer than twice the measurement time for one region. For example, when measurements of the regions are alternately repeated "N times" for each region with a repetition time TR/2, which is a half of the repetition time TR for the measurement of one region, and integration is performed, the total measurement time can be similar to that for the measurement of one region (repetition time×number of times of integration×number of regions (2)=TR/2×N×2=TR×N) with SNR of spectrum signals similar to SNR at the time of measurement of one region.

Further, if the MRS pulse sequence of this embodiment is used in the MRS measurement using the MRI device of this embodiment for performing measurement of two different regions lined on one straight line in the same section, after detection of a magnetic resonance signal of one region, and during the waiting time for waiting for the nuclear magnetization in the region to restore to a substantially thermally equilibrated state, measurement of the other region can be performed. Therefore, if the number of measurement region is doubled, and the total measurement time is made to be twice the measurement time for measurement of one region, the number of times of the measurement of both the regions (number of times of integration) can be increased. Therefore, obtainable SNR of the spectrum signals of both the regions can be improved compared with SNR at the time of measurement of one region. For example, when measurements of the regions are alternately performed "2×N times" for each region with a repetition time TR/2, which is a half of the repetition time TR for the measurement of one region, and integration is performed, if the total measurement time is made to be twice the measurement time for one region (repetition time×number of times of integration×number of regions (2)=TR/2×2×N×2=TR×N×2), the number of times of integration is doubled, and therefore obtainable SNR of spectrum signals for both the regions is about √2 times the SNR at the time of measurement of one region.

Further, when the MRS pulse sequence of this embodiment is used in the MRS measurement using the MRI device of this embodiment for performing measurement of two different regions lined on one straight line in the same section, the measurement of the regions may be alternately performed "N times" for each region at the same repetition time TR as that for measurement of one region as in the conventional techniques, and integration may be performed. In such a case, as the total measurement time, time twice the measurement time for measuring one region, "repetition time×number of times of integration×number of regions (2)=TR×N×2=TR×N×2", is required. However, obtainable SNR of the spectrum signals of both the regions is improved compared with SNR at the time of measurement of one region. This is because, for each region, the substantial repetition time becomes twice TR, and therefore each nuclear magnetization can be made closer to a thermally equilibrated state compared with a case of using a pulse sequence of the conventional PRESS method. Degree of the improvement changes for every substance (longitudinal relaxation time T1) depending on the longitudinal relaxation time T1 and the repetition time TR.

Second Embodiment

Hereafter, the second embodiment of the present invention will be explained. In the first embodiment, concerning two measurement regions for which the MRS measurement is performed, when two slices are common to sets of three slices localizing the regions, one of image quality and measurement time is improved without sacrificing the other. According to this embodiment, when one slice is common to sets of three slices localizing two measurement regions, the same effect as that of the first embodiment is obtained. The MRI device of this embodiment explained below is basically the same as that of the first embodiment. The MRI device of this embodiment is explained mainly for configurations different from those of the first embodiment.

Figure 9A:
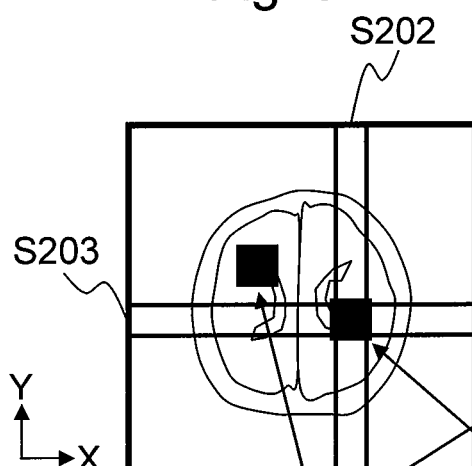
FIG. 9A is a drawing of a transverse image showing an example of positional relationship of an excitation and reversion region and a measurement region in measurement of two different regions not lined on one straight line in the same slice by the PRESS method.
Figure 9B:
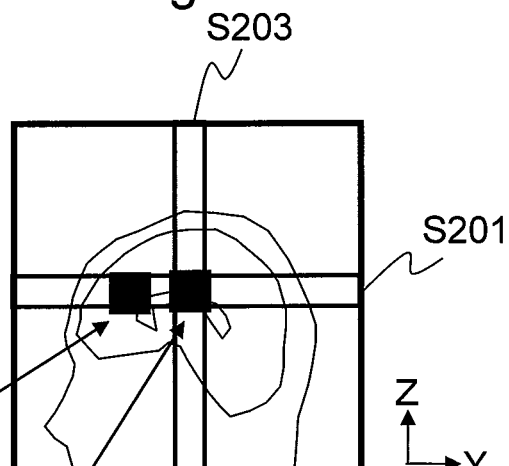
FIG. 9B is a drawing of a sagittal image showing an example of positional relationship of an excitation and reversion region and a measurement region in measurement of two different regions not lined on one straight line in the same slice by the PRESS method.
Figure 9C:
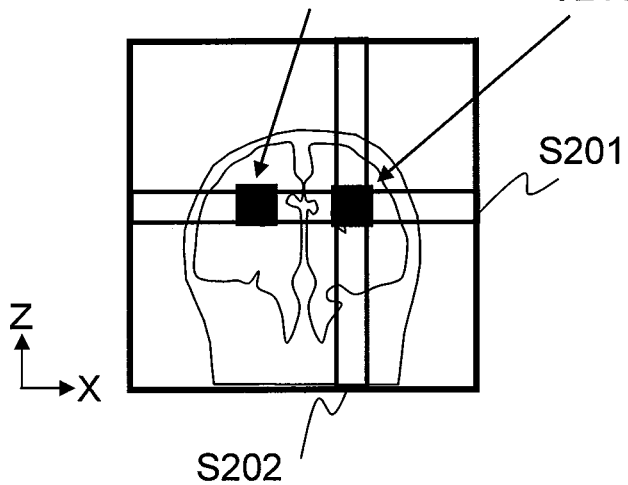
FIG. 9C is a drawing of a coronal image showing an example of positional relationship of an excitation and reversion region and a measurement region in measurement of two different regions not lined on one straight line in the same slice by the PRESS method.

First, there is considered a case of measuring two regions (first region V210 and second region V220) by the conventional PRESS method, where one slice (first slice S201 in this example) is common to the sets of three slices localizing the regions, as shown in FIGS. 9A, 9B, and 9C. When the first region V210 is selectively excited with the MRS pulse sequence shown in FIG. 3, nuclear magnetization in the first slice S201 is excited by the 90° pulse RF1 and the gradient magnetic field Gs1. Since the first slice S201 is a slice also localizing the second region V220, after the irradiation of the 90° pulse RF1, the second region V220 is also pseudo saturated. Therefore, for example, when the first region V110 is measured, and then the second region V120 is measured, it is necessary to wait for the nuclear magnetization in the second region V120 to restore to a thermally equilibrated state.

Figure 10:
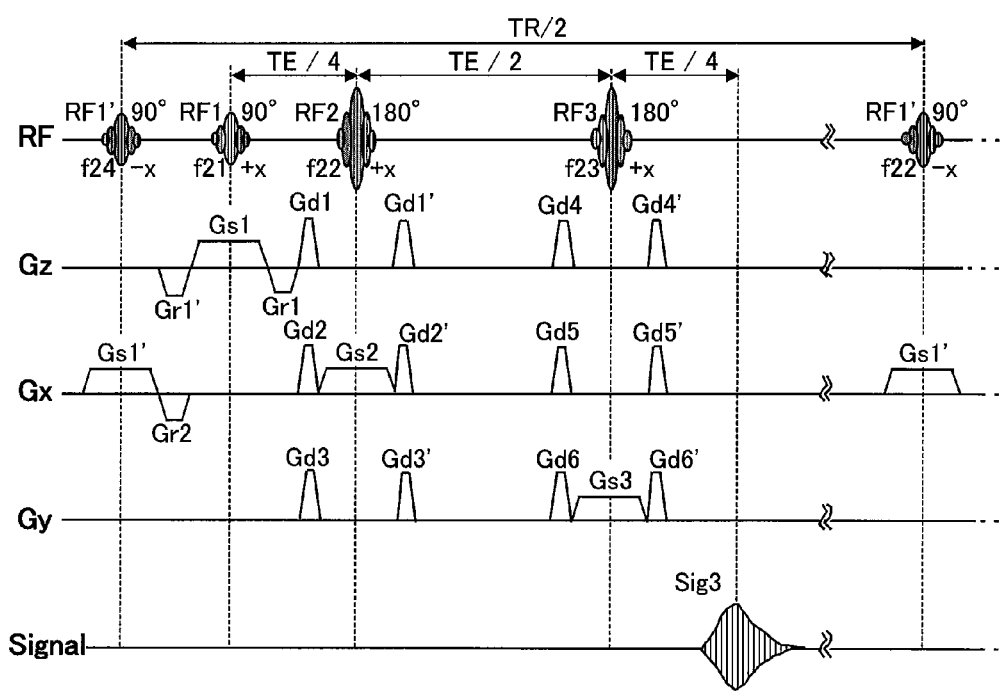
FIG. 10 shows an example of pulse sequence according to the second embodiment.
Figure 11A:
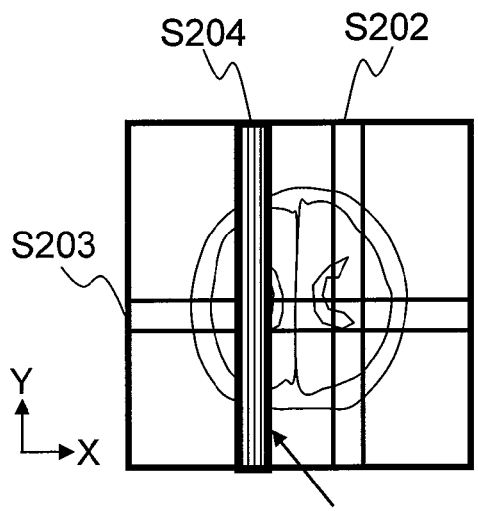
FIG. 11A is a drawing of a transverse image for positioning for explaining a slice excited and reversed with the pulse sequence according to the second embodiment.
Figure 11B:
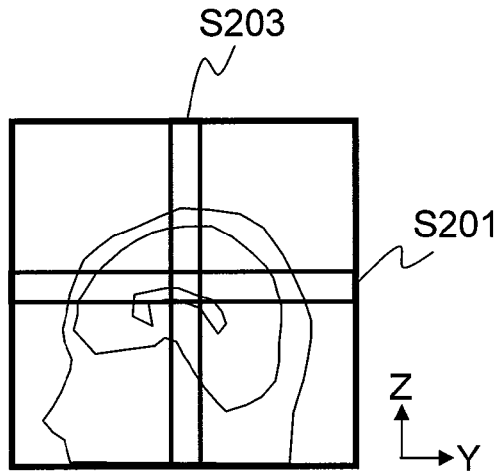
FIG. 11B is a drawing of a sagittal image for position reference for explaining a slice excited and reversed with the pulse sequence according to the second embodiment.
Figure 11C:
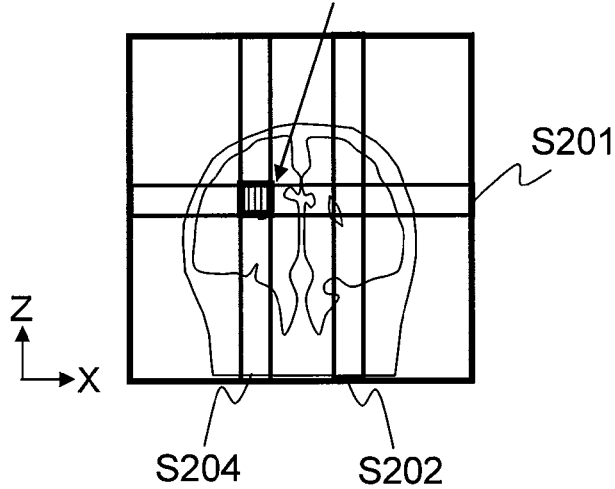
FIG. 11C is a drawing of a coronal image for position reference for explaining a slice excited and reversed with the pulse sequence according to the second embodiment.

In this embodiment, the pulse sequence is configured so that the second region V220 is restored to a thermally equilibrated state during the selective excitation of the first region V210. Hereafter, the MRS pulse sequence of this embodiment for realizing the above will be explained. FIG. 10 is a drawing for explaining an example of the MRS pulse sequence of this embodiment. FIGS. 11A, 11B, and 11C are drawings for explaining the region excited and reversed with the MRS pulse sequence shown in FIG. 10. Further, FIGS. 12A, 12B, and 12C are drawings for explaining regions to be measured with the MRS pulse sequence shown in FIG. 10. Among the images shown in FIGS. 11A, 11B, 11C, 12A, 12B, and 12C, images of FIGS. 11A and 12A are transverse images for positioning, images of FIGS. 11B and 12B are sagittal images for position reference, and images of FIGS. 11C and 12C are coronal images for position reference. This pulse sequence is stored in the memory 11. In the MRI device 100 of this embodiment, the sequence control device 14 operates the parts according to directions given by the computer 9 to perform the MRS measurement.

First, the measurement regions of this embodiment will be explained. The measurement regions of this embodiment consist of the first region V210 and the second region V220 shown in FIGS. 12A to 12C. The first region V210 is localized (specified) with the first slice S201, the second slice S202, and the third slice S203. Further, the second region V220 is localized (specified) with the first slice S201, the fourth slice S204, and the fifth slice S205. Thus, the first slice S201 is common for the first region V210 and second region V220. The second slice S202 and the fourth slice S204, and the third slice S203 and the fifth slice S205 are completely different from each other, respectively. Further, the thicknesses of the second slice S202, the fourth slice S204, the third slice S203 and the fifth slice S205 are not particularly limited. Hereafter, two regions of which arrangement and size are in such a relationship as described above are referred to as regions not lined on one straight line in the same slice.

Hereafter, for such two regions not lined on one straight line in the same slice as mentioned above, there will be explained such an MRS pulse sequence of this embodiment that, when one region (for example, the first region V210) is selectively excited by the PRESS method, the other region (second region V220) is made to be in a thermally equilibrated state. The outline is given as follows: immediately before exciting the common slice (first slice S201), the slice not common (fourth slice S204 or fifth slice S205) is excited by using a radio frequency magnetic field of which phase is different by 180° from that of the radio frequency magnetic field used for exciting the common slice. Thereby, when the common slice (first slice S201) is excited, the region where both the slices (first slice S201 and fourth slice S204 or fifth slice S205) intersect (including the second region V220, but not including the first region V210) is made to be in a thermally equilibrated state. Thus, although the pulse sequence of this embodiment is basically the same as that of the MRS pulse sequence of the first embodiment, since the common slice consists of a slice for one section, the slice affected when the first region V210 is selectively excited consists of one slice, and an operation of restoring only the nuclear magnetization in that slice to a thermally equilibrated state is sufficient. Hereafter, detailed procedure will be explained with reference to the aforementioned drawings. The explanation is made by exemplifying a case of using the fourth slice S204 to eliminate the influence of the selective excitation of the first region V210. Instead of the fourth slice S204, the fifth slice S205 may be used.

As shown in FIG. 10, in the first place, in order to obtain an excited state of nuclear magnetization in the fourth slice S204 including the second region V220 and parallel to the second slice S202, the gradient magnetic field Gs1' of the X axis direction for selection of the fourth slice S204 is applied, and the 90° pulse RF1' having a first transmission frequency f24 is irradiated at the same time. The first transmission frequency f24 is determined so that the fourth slice S204 selected in combination with the gradient magnetic field Gs1' includes the second region V220, but does not include the first region V210. Hereafter, this embodiment will be explained by exemplifying a case where slice thickness of the fourth slice S204 is set to be equivalent to the width of the second region V220 in the X axis direction, and further, the phase of the 90° pulse RF1' is −x.

After completion of the application of the gradient magnetic field Gs1', the gradient magnetic field Gs1 of the Z axis direction for selection of the first slice S201 perpendicularly intersecting with the application axis of the gradient magnetic field Gs1' is applied, and the 90° pulse RF1 having a phase (+x) corresponding to 180° reverse of the phase (−x) of the 90° pulse RF1' is irradiated at the same time. The transmission frequency f21 of the 90° pulse RF1 is determined so that the first slice S201 selected in combination with the gradient magnetic field Gs1 includes the first region V210. Here, explanation will be made by exemplifying a case where slice thickness of the first slice S201 is set to be equivalent to the width of the first region V210 in the Z axis direction. As shown in FIGS. 11A to 11C, the nuclear magnetization in the intersecting region K230 where the fourth slice S204 and the first slice S201 intersect is thereby restored to be in a substantially thermally equilibrated state, and nuclear magnetization in the first slice S201 except for the intersecting region K230 is made to be in an excited state.

Then, after TE/4 from the irradiation of the 90° pulse RF1, the gradient magnetic field Gs2 of the X axis direction for selection of the second slice S202 is applied, and the 180° pulse RF2 having a second transmission frequency f21 different from the first transmission frequency f24 is irradiated at the same time. The second transmission frequency f21 is determined so that the second slice S202 selected in combination with the gradient magnetic field Gs2 includes the first region V210, but does not include the second region V220. Here, explanation will be made by exemplifying a case where slice thickness of the second slice S202 is set to be equivalent to the width of the first region V210 in the X axis direction. Among the nuclear magnetization in the first slice S201 except for the intersecting region K230 excited by the 90° pulse RF1, nuclear magnetization in the region also included in the second slice S202 is thereby reversed by 180°.

Furthermore, after TE/2 from the irradiation of the 180° pulse RF2, the gradient magnetic field Gs3 of the Y axis direction for selection of the third slice S203 perpendicularly intersecting with the application axes of the gradient magnetic fields Gs1 and Gs2 is applied, and the 180° pulse RF3 is irradiated at the same time. Thereby, the nuclear magnetization in the third slice S203 is reversed. The transmission frequency f23 of the 180° pulse RF3 is determined so that the third slice S203 selected in combination with the gradient magnetic field Gs3 includes the first region V210. Explanation will be made here by exemplifying a case where slice thickness of the third slice S203 is set to be equivalent to the width of the first region V210 in the Y axis direction.

By the application of the four sets of the radio frequency magnetic fields and the gradient magnetic fields mentioned above, a magnetic resonance signal Sig3 of which echo time is at a point after TE/4 from the irradiation of the 180° pulse RF3 is generated from the first region V210. This magnetic resonance signal Sig3 is detected with the reception coil 6 at a predetermined sampling interval.

Also in this pulse sequence, the gradient magnetic field Gr2 applied immediately after the application of the gradient magnetic field Gs1' is a gradient magnetic field for rephasing for the gradient magnetic field Gs1'. Further, the gradient magnetic field Gr1' and the gradient magnetic field Gr1, which are applied before and after the application of the gradient magnetic field Gs1, are gradient magnetic fields for dephasing and rephasing for the gradient magnetic field Gs1. Further, the gradient magnetic field Gd1 and the gradient magnetic field Gd1', the gradient magnetic field Gd2 and the gradient magnetic field Gd2', and the gradient magnetic field Gd3 and the gradient magnetic field Gd3', which are applied before and after the application of the 180° pulse RF2, are gradient magnetic fields for dephasing the nuclear magnetization excited by the irradiation of the 180° pulse RF2 without dephasing the nuclear magnetization excited by the irradiation of the 90° pulse RF1 and thereby reducing pseudo signals. Further, the gradient magnetic field Gd4 and the gradient magnetic field Gd4', the gradient magnetic field Gd5 and the gradient magnetic field Gd5', and the gradient magnetic field Gd6 and the gradient magnetic field Gd6', which are applied before and after the application of the 180° pulse RF3, are gradient magnetic fields for dephasing the nuclear magnetization excited by the irradiation of the 180° pulse RF3 without dephasing the nuclear magnetization excited by the irradiation of the 90° pulse RF1, and thereby reducing pseudo signals.

As explained above, by executing the MRS pulse sequence of this embodiment, as shown in FIGS. 12A, 12B, and 12C, only the nuclear magnetization included in the measurement region V210 where the three slices, the first slice S201, the second slice S202 and the third slice S203, intersect can be selectively excited, and the nuclear magnetization included in the second region V220 where the fourth slice S204, the first slice S205 and the first slice S201 intersect can be maintained to be in a substantially thermally equilibrated state.

When the magnetic resonance signal Sig3 from the first region V210 is measured, the second region V220 is made to be in a substantially thermally equilibrated state. Therefore, the excitation of the second region V220 can be started immediately after the excitation and detection of the first region V210. Accordingly, when the measurement is performed by repeating excitation and detection for securing SNR, the excitation and detection of the second region V220 can be performed during the waiting time for waiting for the nuclear magnetization in the first region V210 to restore to a substantially thermally equilibrated state (for example, TR/2).

For example, the MRS pulse sequence of this embodiment is executed to acquire the magnetic resonance signal Sig3 from the first region V210, and immediately after that, a similar measurement is performed by changing the transmission frequency of the 90° pulse RF1' to f2, and the transmission frequency of the 180° pulse RF2 to f3 to detect the magnetic resonance signal Sig4 from the second region V220 at a predetermined sampling interval. Also in this case, when the magnetic resonance signal Sig4 from the second region V220 is measured, the first region V210 is made to be in a substantially thermally equilibrated state. Therefore, the excitation and detection of the first region V210 can be performed during the waiting time for waiting for the nuclear magnetization in the second region V220 to restore to a substantially thermally equilibrated state after the excitation and detection of the second region V220 (for example, TR/2).

As explained above, when the first region V210 and the second region V220 are not lined on one straight line in the same slice, the MRS pulse sequence of this embodiment enables measurement of the two regions during one TR by alternately performing the "measurement of the first region V210" and the "measurement of the second region V220" with a repetition time TR/2. In this case, the excitation and detection for the first region V210 and the second region V220 are repeated substantially with the repetition time TR, and the nuclear magnetization in each region is excited from a steady state (substantially thermally equilibrated state) similar to that at the time of measurement of one region, and detected. Therefore, by performing Fourier transform of integrated magnetic resonance signals Sig3 repeatedly detected from the first region V210, and integrated magnetic resonance signals Sig4 repeatedly detected from the second region V220 in the time axis direction, magnetic resonance spectrum signals from the first region V210 and magnetic resonance spectrum signals from the second region V220 can be acquired, respectively.

As explained above, according to the MRS pulse sequence of this embodiment, in the measurement of two different regions locating in the same section, but not lined on one straight line (first region V210 and second region V220), the same effect as that of the first embodiment can be obtained.

Embodiments of the magnetic resonance imaging device according to the present invention are described above. However, the present invention is not limited to the aforementioned embodiments, and various changes and applications thereof are possible.

For example, the gradient magnetic fields for dephasing and/or the gradient magnetic fields for rephasing may be changed. Specifically, in the MRS pulse sequences of the aforementioned embodiments, the three pairs of gradient magnetic fields, the gradient magnetic fields Gd1, Gd2 and Gd3 for dephasing and the gradient magnetic fields Gd1', Gd2' and Gd3' for rephasing, are applied before and after the irradiation of the 180° pulse RF2, and the three pairs of gradient magnetic fields, the gradient magnetic fields Gd4, Gd5 and Gd6 for dephasing and the gradient magnetic fields Gd4', Gd5' and Gd6' for rephasing, are applied before and after the irradiation of the 180° pulse RF3. However, three pairs of gradient magnetic fields for dephasing and gradient magnetic fields for rephasing do not necessarily need to be applied for each case, and for example, only one pair of them may be applied before and after each of the 180° pulses RF2 and RF3, or one pair of them may be applied before and after the 180° pulses RF2 and three pairs of them may be applied before and after the 180° pulses RF3. Further, as the configuration of each pair, a pair of the same polarity may be sufficient, and it may be a pair of those having positive polarity and positive polarity, or negative polarity and negative polarity.

Figure 13:
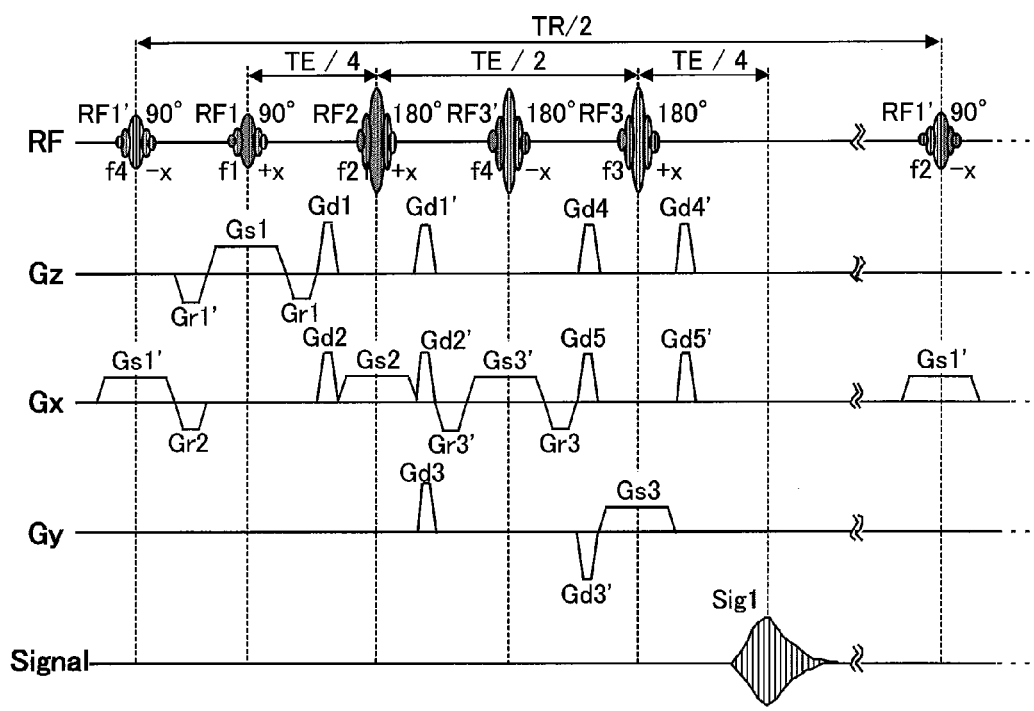
FIG. 13 shows a modified example of pulse sequence according to the first embodiment.

Further, in the MRS pulse sequence of the first embodiment, the three pairs of gradient magnetic fields, the gradient magnetic fields Gd1, Gd2 and Gd3 for dephasing and the gradient magnetic fields Gd1', Gd2' and Gd3' for rephasing, are applied before and after the irradiation of the 180° pulse RF2, and the three pairs of gradient magnetic fields, the gradient magnetic fields Gd4, Gd5 and Gd6 for dephasing and the gradient magnetic fields Gd4', Gd5' and Gd6' for rephasing, are applied before and after the irradiation of the 180° pulse RF3. However, three pairs of gradient magnetic fields for dephasing and gradient magnetic fields for rephasing do not necessarily need to be applied for each case. For example, there may be used a configuration that, as shown in FIG. 13, as for at least one axis (Gy), the gradient magnetic field Gd3 of positive polarity for dephasing is applied between the 180° pulse RF2 and the 180° pulse RF3', and the gradient magnetic field Gd3' of negative polarity for rephasing is applied between the 180° pulse RF3' and the 180° pulse RF3. Thereby, the "generation of pseudo signals resulting from transverse magnetization components", which occurs when the excitation profile of the 180° pulse RF3' is imperfect, can be reduced.

Figure 14:
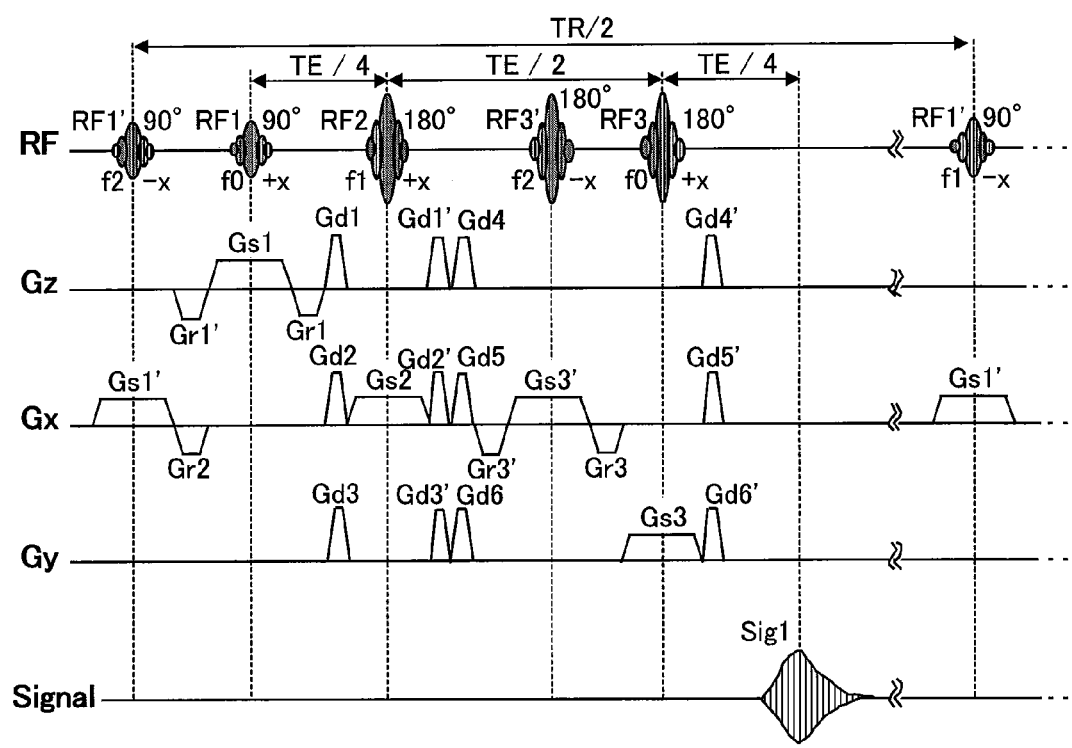
FIG. 14 shows another modified example of pulse sequence according to the first embodiment.

Further, in the MRS pulse sequences of the aforementioned embodiments, the gradient magnetic fields Gd4, Gd5, and Gd6 for dephasing are applied immediately before the 180° pulse RF3. However, the timings of the application of these gradient magnetic fields for dephasing are not limited to the above. For example, in the example of the MRS pulse sequence of the first embodiment, they may be applied immediately before the 180° pulse RF3', as shown in FIG. 14. This makes it possible to avoid the dephasing effect exerted by the gradient magnetic fields Gd4, Gd5, and Gd6 on the transverse magnetization components resulting from the excitation profile of the 180° pulse RF3' that is not an ideal rectangle. Thereby, it also becomes possible to make the transverse magnetization components, resulting from the excitation profile of the 180° pulse RF3' that is not an ideal rectangle, closer to a thermally equilibrated state.

Figure 15:
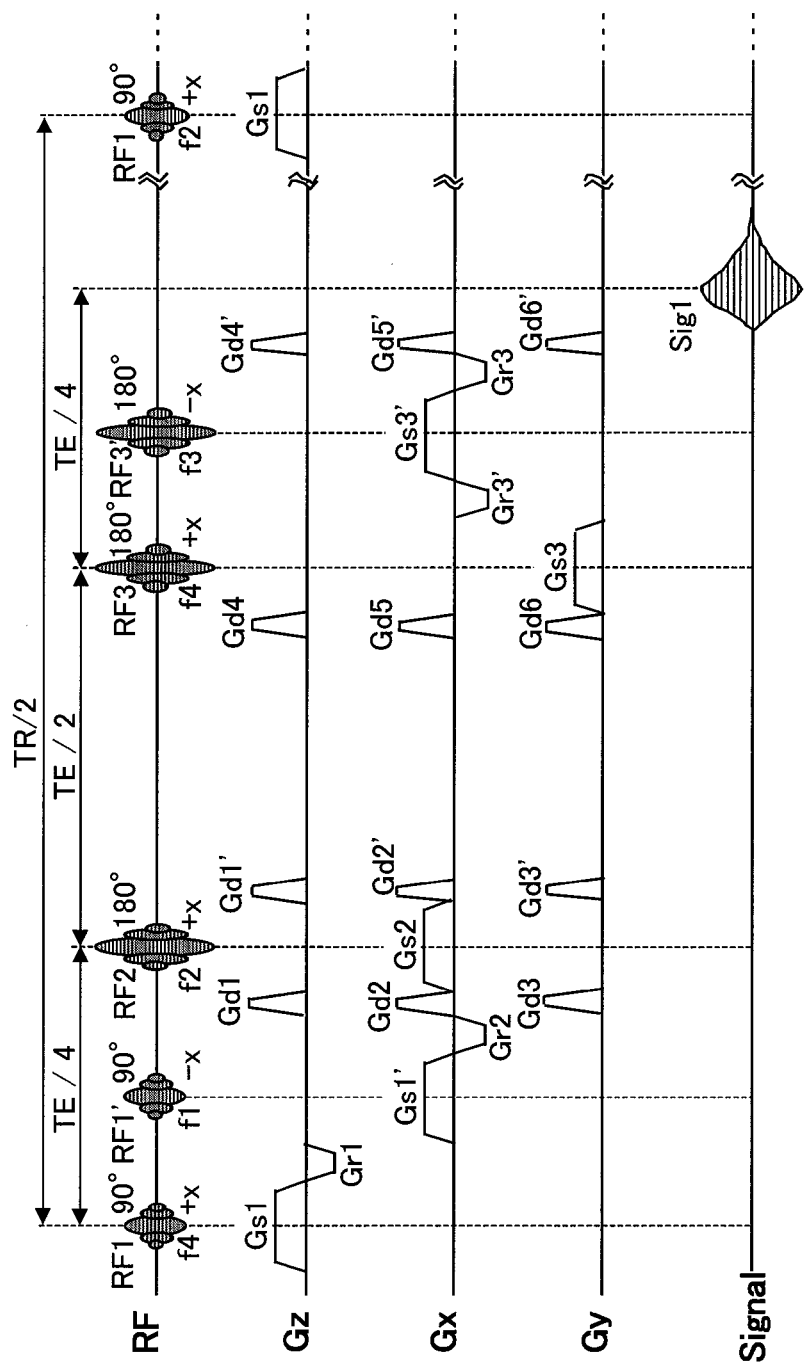
FIG. 15 shows still another modified example of pulse sequence according to the first embodiment.

Further, in the MRS pulse sequences of the aforementioned embodiments, the 90° pulse RF1', the gradient magnetic fields Gs1' and the gradient magnetic field Gr2 are applied immediately before the application of the 90° pulse RF1 and the gradient magnetic field Gs1. However, the timings of the application of these radio frequency magnetic field and gradient magnetic fields are not limited to the above. For example, the same effect can be obtained, even if they are applied immediately after the application of the 90° pulse RF1 and the gradient magnetic fields Gs1 and Gr1, as shown in FIG. 15. Similarly, in the MRS pulse sequence shown in FIG. 6, the 180° pulse RF3', the gradient magnetic field Gr3', the gradient magnetic field Gs3' and the gradient magnetic field Gr3 are applied immediately before the application of the 180° pulse RF3 and the gradient magnetic field Gs3, but the timings of the application of these radio frequency magnetic field and gradient magnetic fields are not limited to the above. For example, the same effect can be obtained even if they are applied immediately after the 180° pulse RF3 and the gradient magnetic field Gs3, as shown in FIG. 15.

Further, the aforementioned embodiments were explained by exemplifying the case of changing the position of the slice to be excited or reversed (selected slice) by changing transmission frequencies of radio frequency magnetic fields. However, the method for changing position of a selected slice is not limited to the above. For example, there may be used a configuration that position of a selected slice is changed by changing application polarity or application intensity of simultaneously applied gradient magnetic fields for slice selection without changing transmission frequency of the radio frequency magnetic fields. Also in such a case, a similar effect can be obtained by, immediately before or after one region is selectively made to be in an excited state or reversed state using a first radio frequency magnetic field, selectively making the other region be in an excited state or reversed state using a second radio frequency magnetic field of which phase corresponds to reverse of the phase of the first radio frequency magnetic field.

Furthermore, the aforementioned embodiments were explained by exemplifying a case of setting the width of the selected slice localizing a region desired to be maintained in a thermally equilibrated state to be equivalent to the width of the region desired to be maintained in a thermally equilibrated state. However, width of the selected slice is not limited to such a width. As described above, it can be set to be a larger width including the region not for signal detection. In particular, when the excitation profile of the radio frequency magnetic field is not an ideal rectangle, a larger width can provide more efficient restore to a thermally equilibrated state, and thus provide a more precise spectrum.

In addition, compared with concentrations of metabolites, concentration of water contained in the human body is extremely higher. Therefore, if the measurement is performed without suppressing signals of water at a high concentration, weak signals of metabolites are buried in foot of the huge signal peak generated by water, and it becomes difficult to separate and extract signals of metabolites in many cases. Therefore, there may be used a configuration that a treatment for suppressing generation of water signals is performed immediately before performing usual excitation and detection to suppress unnecessary water signals, and then required signals of a metabolite are detected.

Figure 16:
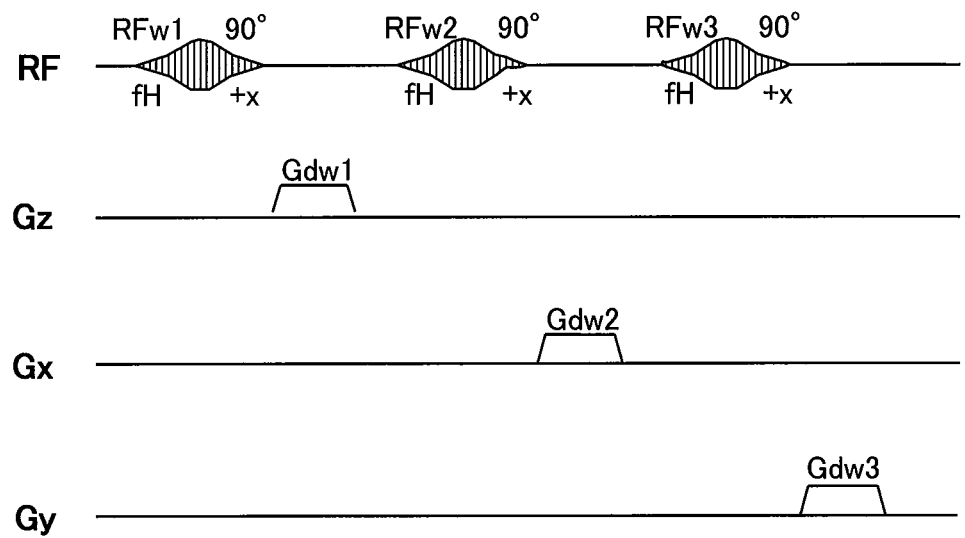
FIG. 16 shows an example of pre-pulse sequence for suppressing water signals in the embodiments of the present invention.

A pre-pulse sequence to be executed in the case of the water-suppressed measurement in which water signals of high concentration are suppressed, and then measurement of a metabolite is performed is shown in FIG. 16. This pre-pulse sequence is executed before the MRS pulse sequence according to each of the aforementioned embodiments. That is, in the water-suppressed measurement, one set of pulse sequences consisting of the pre-pulse sequence shown in FIG. 16 and the MRS pulse sequence according to each of the aforementioned embodiments is executed.

Hereafter, operations using the pre-pulse sequence shown in FIG. 16 and the effect thereof will be explained. First, in order to excite nuclear magnetization contained only in water molecules, a radio frequency magnetic field RFw1 (radio frequency magnetic field for exciting water) of which transmission frequency is set to be the resonant frequency fH of water, and excitation frequency band is set to be approximately the width of water peak is irradiated to selectively excite nuclear magnetization of water. Then, in order to dephase of the nuclear magnetization of water in an excited state to make vectorial sum of the nuclear magnetization of water zero and thereby pseudo saturate the water magnetization, a gradient magnetic field Gdw1 for dephasing is applied. In order to further increase the water signal suppressing effect, a radio frequency magnetic field for exciting water and a gradient magnetic field for dephasing similar to the radio frequency magnetic field RFw1 for exciting water the gradient magnetic field Gdw1 for dephasing are repeatedly applied two or more times. The example shown in this drawing is a pulse sequence for repeating application of the radio frequency magnetic field for exciting water and the gradient magnetic field for dephasing 3 times, and it applies the radio frequency magnetic field RFw1 for exciting water and the gradient magnetic field Gdw1 for dephasing, then a radio frequency magnetic field RFw2 for exciting water and a gradient magnetic field Gdw2 for dephasing, and a radio frequency magnetic field RFw3 for exciting water and a gradient magnetic field Gdw3 for dephasing. In this example, upon application of them, application axis of each gradient magnetic field for dephasing is changed.

And while the pseudo saturated state of the water magnetization attained with this pre-pulse sequence continues, the MRS pulse sequence according to one of the aforementioned embodiments is executed, and weak signals of metabolite are measured.

In such a pre-pulse sequence, a Gaussian waveform showing narrow band excitation frequency characteristics is used for the radio frequency magnetic field for exciting water. The flip angle thereof is set to be around 90° in many cases. In the pre-pulse sequence, the number of times of the application of the radio frequency magnetic field for exciting water and the gradient magnetic field for dephasing is not limited to 3 times. Further, in the example shown in FIG. 16, a gradient magnetic field of any one axis among Gx, Gy and Gz is applied as the gradient magnetic field for dephasing. However, gradient magnetic fields of all three axes of Gx, Gy and Gz may be simultaneously applied, or gradient magnetic fields of any two of the axes may be simultaneously applied. For the gradient magnetic fields for dephasing, various combination and numerical values of the number of application axes and application intensity (application polarity) can be used.

The aforementioned embodiments were explained by exemplifying a case of using the PRESS method for the MRS measurement. However, the method of the MRS measurement is not limited to that method. For example, the procedures explained for the aforementioned embodiments can be used with a pulse sequence for a known MRS measurement method such as the STEAM method. That is, as in the aforementioned embodiments, there may be used a configuration that, in the measurement of two regions, immediately before or after one region is selectively made to be in an excited state or reversed state using a first radio frequency magnetic field, the other region is made to be in an excited state or reversed state by using a second radio frequency magnetic field of which phase corresponds to reverse of the phase of the first radio frequency magnetic field to restore the nuclear magnetization in the other region to a substantially thermally equilibrated state.

Further, the aforementioned embodiments were explained by exemplifying a case where the number of the measurement regions was two. However, the number of the measurement regions is not limited to that. The procedure explained for the aforementioned embodiments can also be applied to a case where three or more regions are measured. That is, there may be used a configuration that, immediately before or after a region for signal detection is made to be in an excited state or reversed state by using a first radio frequency magnetic field, the two or more regions other than the region for signal detection is made to be in an excited state or reversed state by using a second radio frequency magnetic field of which phase corresponds to reverse of the phase of the first radio frequency magnetic field to restore the nuclear magnetization in these regions to a substantially thermally equilibrated state.

Further, in the aforementioned embodiments, there may also be used a configuration that the measurement region is set by a user through the display 10 and the input device 15 using a graphical user interface (GUI). According to the first embodiment, the measurement is performed for two different regions lined on one straight line in the same section, the first region V110 and the second region V120. Therefore, GUI used by a user may have, as one of the functions thereof, a configuration that input into the computer 9 for setting the measurement regions is limited so that the first region V110 and the second region V120 are always lined on one straight line in the same section. In this case, there may be used a configuration that the input is further limited so that the two different regions lined on one straight line, the first region V110 and the second region V120, are always in such a positional relationship that they are in line symmetry with respect to a predetermined straight line. As the predetermined straight line, for example, a longitudinal fissure of cerebrum or the like is conceivable. In addition, there may also be used a configuration that the computer 9 searches for a predetermined straight line on the basis of shape recognition on the image, and automatically sets the straight line.

Similarly, in the second embodiment, there may be used a configuration that the computer 9 limits the setting of the two different regions, the first region V210 and the second region V220, so that they are not lined on one straight line in the same section. Furthermore, there may also be used a configuration that the computer 9 judges the positional relationship of two regions inputted, and determines which MRS pulse sequence of the aforementioned first embodiment or the second embodiment is used.

Further, for the aforementioned embodiments, MRS measurements in which spectrum signals are measured from one to several regions were explained. However, similar effect can also be obtained in the magnetic resonance spectroscopic imaging (henceforth abbreviated as MRSI), in which spectra of multiple regions (pixels) are simultaneously obtained, and imaging is performed for every molecule. For example, in the MRSI measurement, the measurement may be performed for two different slabs (assemblies of multiple regions), which are each divided into many regions (pixels). In such a case, the slab that is not the object of signal detection is made to be in an excited or reversed state beforehand, and immediately before or after the slab for signal detection is excited or reversed by using a first radio frequency magnetic field, the inside of the slab that is not the object of the signal detection is made to be in an excited or reversed state by using a second radio frequency magnetic field of which phase corresponds to reverse of the phase of the first radio frequency magnetic field to restore the nuclear magnetization in the slab that is not the object of the signal detection to a substantially thermally equilibrated state. With this procedure, an effect equivalent to that of the case of the MRS measurement explained for the aforementioned embodiments can be obtained.

Figure 17:
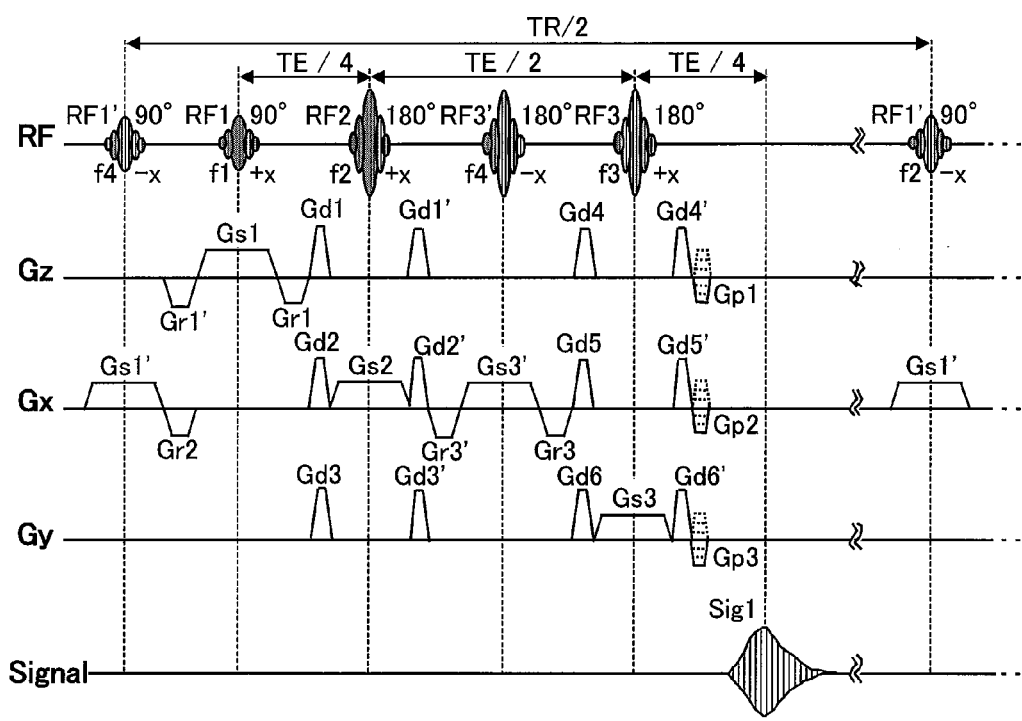
FIG. 17 shows a modified example of pulse sequence according to the first embodiment.

In addition, the aforementioned effect can be obtained, for example, when the MRSI measurement is performed with a combination of a general pulse sequence called 3D-CSI or 4D-CSI, a high-speed MRSI pulse sequence using an oscillating gradient magnetic field called EPSI, or the like and a region selection method such as the PRESS method and the STEAM method. As an example, a pulse sequence for a combination of the 4D-CSI pulse sequence and the PRESS method based on the MRS pulse sequence according to the first embodiment is shown in FIG. 17. In the pulse sequence shown in FIG. 17, the gradient magnetic fields Gp1, Gp2 and Gp3 for phase encoding are applied immediately before the detection of Sig1. However, the timing of the application of these gradient magnetic fields for phase encoding is not limited to the above, and they may be applied between RF1 and RF2 or between RF2 and RF3'.

Further, in general, before the MRS measurement or the MRSI measurement is performed, the procedure called shimming is performed in many cases, in which application intensity of a shimming magnetic field generated by the shim coil 4 and application intensity of an offset magnetic field generated by the gradient coil 3 are adjusted to improve uniformity of the static magnetic field. When the MRS measurement or the MRSI measurement is performed for two or more regions, in advance of the MRS measurement or the MRSI measurement of all the regions, the shimming magnetic field intensity and the offset magnetic field intensity for improving uniformity of the static magnetic fields are calculated beforehand for every region. Then, there may be used a configuration that when the MRS measurement or the MRSI measurement is performed for each region, the measurement of each region is alternately performed with changing the settings so that the shimming magnetic field intensity and the offset magnetic field intensity are changed to those calculated beforehand. Thereby, quality of the spectrum obtained from each region can be improved.

Example

Hereafter, an example of the present invention will be described. In this example, by using the MRI device 100 shown in FIG. 1A of which static magnetic field intensity is 1.5 teslas, and executing the pre-pulse sequence (water suppressing sequence) shown in FIG. 16 and then the MRS pulse sequence of the first embodiment, the MRS measurement was performed for two different regions V1 and V2 lined on one straight line in the same section. In this measurement, the objective nuclide was proton, and the object of the measurement was the head of human body.

Figure 18A:
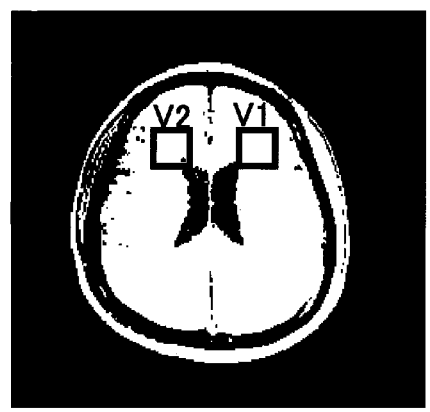
FIG. 18A is a drawing of an example of the present invention for explaining spatial arrangement of two regions V1 and V2 to be measured.

The measurement regions V1 and V2 are shown in FIG. 18A. In the measurement of the region V1, execution of the water suppressing sequence took about 100 ms, and execution of the MRS pulse sequence took about 900 ms. The time taken for executing the MRS pulse sequence is the time until completion of the detection of Sig1 with a signal detection time of about 750 ms and TE of 136 ms. Also in the measurement of the region V2, execution of the water suppressing sequence and the MRS pulse sequence took 100 ms+900 ms=1000 ms. In this case, if TR was 2000 ms, the waiting time after completion of the detection of Sig1 generated from the region V1 (time of waiting for restore of the nuclear magnetization in the region V1 to a substantially thermally equilibrated state) was about 1000 ms (=2000 ms−100 ms−900 ms). Therefore, during this waiting time, the measurement of the region V2 (measurement time: 1000 ms) could be performed to complete the detection of Sig2 generated from the region V2.

Figure 18B:
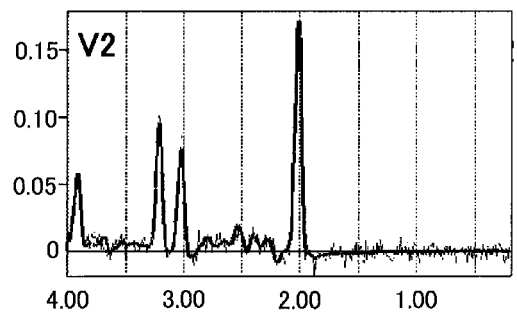
FIG. 18B is a drawing of an example of the present invention for explaining magnetic resonance spectrum data obtained from the region V2.
Figure 18C:
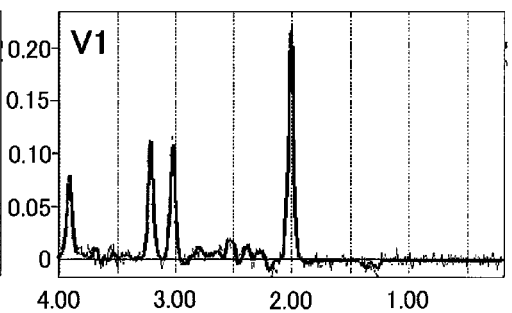
FIG. 18C is a drawing of an example of the present invention for explaining magnetic resonance spectrum data obtained from the region V1.
Figure 19A:
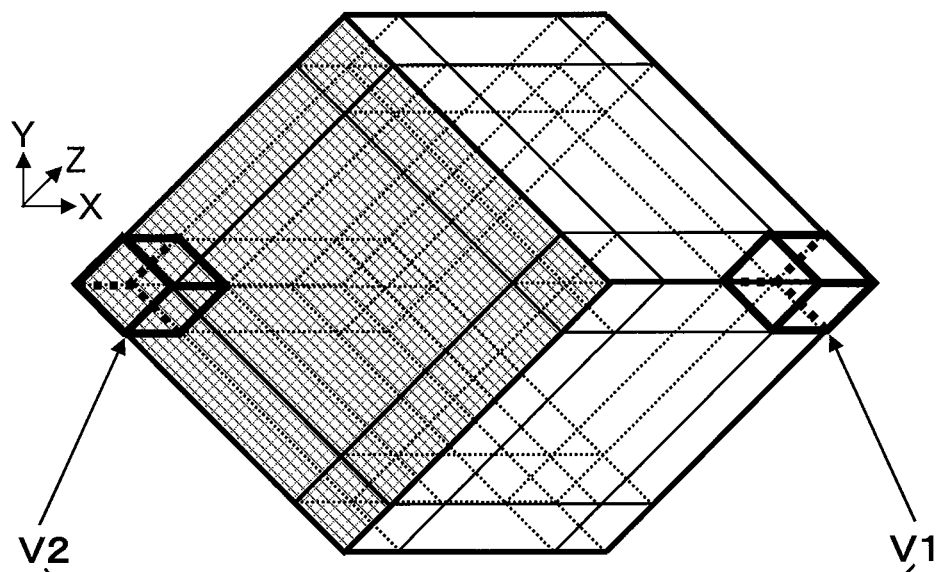
FIG. 19A is a drawing for explaining positional relationship of two regions selectively excited by a conventional method.
Figure 19B:
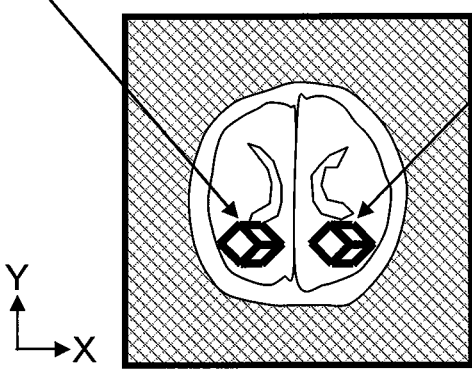
FIG. 19B is a drawing for explaining the selectively excited region projected on an image for positioning.
Figure 20:
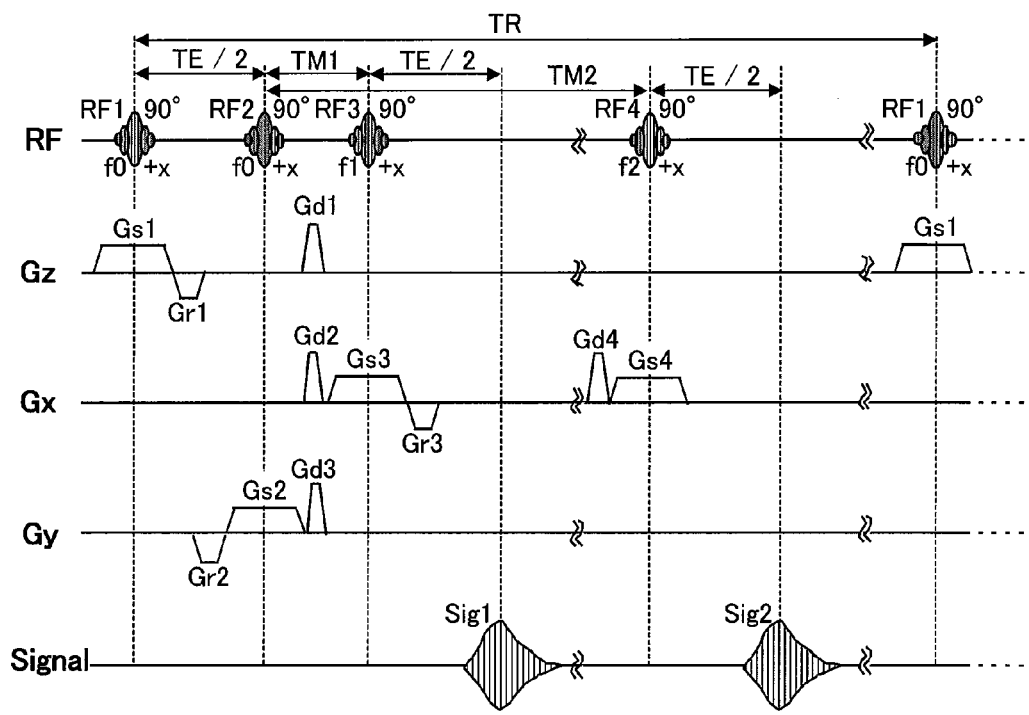
FIG. 20 shows an improved pulse sequence based on a conventional pulse sequence for the STEAM method.

As described above, the measurements of Sig1 and Sig2 performed during 1 TR (=2000 ms) were considered one set, and this set was repeated 128 times for integration. The measurement results are shown in FIGS. 18B and 18C. In these drawings, the vertical axes indicate signal intensity, and the horizontal axes indicate chemical shift (unit: ppm). In this example, the integration spectra shown in these drawings could be obtained in a total measurement time of 4 minutes and 16 seconds.

DENOTATION OF REFERENCE NUMERALS

1: Subject, 2: static magnetic field coil, 3: gradient coil, 4: shim coil, 5: transmission coil, 6: reception coil, 7: transmitter, 8: receiver, 9: computer, 10: display, 11: memory, 12: gradient magnetic field power supply, 13: shim power supply, 14: sequence control device, 100: MRI device, 200: MRI device, 300: MRI device, RF: radio frequency magnetic field, Gz: gradient magnetic field of Z axis direction, Gy: gradient magnetic field of Y axis direction, Gx: gradient magnetic field of X axis direction, RF1: radio frequency magnetic field, RF2: radio frequency magnetic field, RF3: radio frequency magnetic field, RF1': radio frequency magnetic field, RF3': radio frequency magnetic field, Gs1: gradient magnetic field for slice selection, Gs2: gradient magnetic field for slice selection, Gs3: gradient magnetic field for slice selection, Gs4: gradient magnetic field for slice selection, Gr1: gradient magnetic field for rephasing, Gd1': gradient magnetic field for rephasing, Gd2': gradient magnetic field for rephasing, Gd3': gradient magnetic field for rephasing, Gd4': gradient magnetic field for rephasing, Gd5': gradient magnetic field for rephasing, Gd6': gradient magnetic field for rephasing, Gr2: gradient magnetic field for rephasing, Gr3: gradient magnetic field for rephasing, Gd1: gradient magnetic field for dephasing, Gd2: gradient magnetic field pulse for dephasing, Gd3: gradient magnetic field for dephasing, Gd4: gradient magnetic field for dephasing, Gd5: gradient magnetic field for dephasing, Gd6: gradient magnetic field for dephasing, Gr1': gradient magnetic field for dephasing, Gr3': gradient magnetic field for dephasing, Gdw1: gradient magnetic field for dephasing, Gdw2: gradient magnetic field for dephasing, Gdw3: gradient magnetic field for dephasing, Sig: magnetic resonance signal, Sig1: magnetic resonance signal, Sig2: magnetic resonance signal, Sig3: magnetic resonance signal, TR: repetition time, TE: echo time, RFw1: radio frequency magnetic field for exciting water, RFw2: radio frequency magnetic field for exciting water, RFw3: radio frequency magnetic field for exciting water, Gp1: gradient magnetic field for phase encoding, Gp2: gradient magnetic field for phase encoding, and Gp3: gradient magnetic field for phase encoding

The invention claimed is:

1. A magnetic resonance imaging device comprising magnetic field generating means for generating a static magnetic field, a radio frequency magnetic field, and a gradient magnetic field, respectively, a detection means for detecting magnetic resonance signals generated from a subject placed in the static magnetic field, a calculation means for creating a magnetic resonance spectrum from the magnetic resonance signals and displaying the spectrum on a display, and a measurement control means for controlling operations of the magnetic field generating means, the detection means, and the calculation means to perform measurement, wherein:

the measurement control means comprises:
a selective excitation means for localizing and selecting a first region that generates the magnetic resonance signals with the radio frequency magnetic field and the gradient magnetic field, and a steadying means for thermally equilibrating nuclear magnetization in one or more second regions different from the first region with the radio frequency magnetic field and the gradient magnetic field during the localization of the first region by the selective excitation means, the first region and the second regions are each specified with perpendicularly intersecting three slices, one or two slices among the three slices specifying each region are common, and the slices of not common are located completely different position, and the steadying means steadies nuclear magnetization in the second regions by using a radio frequency magnetic field of which phase is different by 180 degrees from that of the radio frequency magnetic field used by the selective excitation means.

2. The magnetic resonance imaging device according to claim 1, wherein:

the selective excitation means localizes the first region by successively applying the radio frequency magnetic fields together with the gradient magnetic fields in three axis directions each parallel to the three slices, and the steadying means excites each region of the second regions a number of times corresponding to number of slices common to the slices localizing the first region with a radio frequency magnetic field each having a phase different by 180 degrees from that of the radio frequency magnetic field used by the selective excitation means for exciting the common slice.

3. The magnetic resonance imaging device according to claim 1, wherein:

two slices are common among slices localizing the first region and the second regions, the selective excitation means comprises:

a first excitation means for applying a first radio frequency magnetic field together with a first gradient magnetic field to attain excitation in one common slice among the three slices localizing the first region, a second excitation means for, after the excitation by the first excitation means, applying a second radio frequency magnetic field together with a second gradient magnetic field to attain excitation in a slice not common among the three slices localizing the first region, and a third excitation means for, after the excitation by the second excitation means, applying a third radio frequency magnetic field together with a third gradient magnetic field to attain excitation in one remaining slice among the three slices localizing the first region, and the steadying means comprises:

a first steadying excitation means for, immediately before or after the excitation by the first excitation means, attaining excitation in a first slice that is an slice not common among the three slices localizing each region of the second region or regions by using a first reversion radio frequency magnetic field having a phase different by 180° from that of the first radio frequency magnetic field, and a second steadying excitation means for, immediately before or after the excitation by the third excitation means, attaining excitation in the first slice by using a second reversion radio frequency magnetic field having a phase different by 180° from that of the third radio frequency magnetic field.

4. The magnetic resonance imaging device according to claim 3, wherein:

transmission frequency of the first reversion radio frequency magnetic field is further changed form that of the first radio frequency magnetic field, and transmission frequency of the second reversion radio frequency magnetic field is further changed form that of the third radio frequency magnetic field.

5. The magnetic resonance imaging device according to claim 1, wherein:
one slice is common among three slices localizing the first region and the second regions,
the selective excitation means comprises:
a first excitation means for applying a first radio frequency magnetic field together with a first gradient magnetic field to attain excitation in a common slice among the three slices localizing the first region,
a second excitation means for, after the excitation by the first excitation means, applying a second radio frequency magnetic field together with a second gradient magnetic field to attain excitation in one slice not common among the three slices localizing the first region, and
a third excitation means for, after the excitation by the second excitation means, applying a third radio frequency magnetic field together with a third gradient magnetic field to attain excitation in one remaining slice among the three slices localizing the first region, and
the steadying means comprises:
a first steadying excitation means for, immediately before or after the excitation by the first excitation means, attaining excitation in a slice not common among the three slices localizing each region of the second region or regions by using a first reversion radio frequency magnetic field having a phase different by 180° from that of the first radio frequency magnetic field.

6. The magnetic resonance imaging device according to claim 5, wherein:
transmission frequency of the first reversion radio frequency magnetic field is further changed from that of the first radio frequency magnetic field.

7. The magnetic resonance imaging device according to claim 1, wherein:
the magnetic resonance imaging device further comprises a means for executing a water suppressing sequence execution means for executing a sequence for suppressing magnetic signals from water in advance of the process by the selective excitation means and the steadying means.

8. The magnetic resonance imaging device according to claim 1, wherein:
the measurement control means starts measurement of any one of regions among the second region or regions immediately after completion of measurement of the first region.

* * * * *